United States Patent
Binboga

(10) Patent No.: US 8,699,273 B2
(45) Date of Patent: Apr. 15, 2014

(54) BITLINE VOLTAGE REGULATION IN NON-VOLATILE MEMORY

(75) Inventor: Evrim Binboga, Pleasanton, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/563,206

(22) Filed: Jul. 31, 2012

(65) Prior Publication Data

US 2014/0036595 A1  Feb. 6, 2014

(51) Int. Cl.
*G11C 16/00* (2006.01)

(52) U.S. Cl.
USPC ............. 365/185.19; 65/185.18; 65/185.23; 65/185.28

(58) Field of Classification Search
USPC .................................................. 365/185.02
See application file for complete search history.

(56) References Cited

U.S. PATENT DOCUMENTS

| | | | | |
|---|---|---|---|---|
| 5,379,254 A * | 1/1995 | Chang | ............. | 365/182 |
| 5,654,917 A * | 8/1997 | Ogura et al. | ............. | 365/185.18 |
| 7,583,542 B2 * | 9/2009 | Gasquet | ............. | 365/189.09 |
| 7,593,264 B2 * | 9/2009 | Shih et al. | ............. | 365/185.18 |
| 7,800,948 B2 * | 9/2010 | Ueda | ............. | 365/185.18 |
| 2010/0014354 A1 | 1/2010 | Lambrache et al. | | |
| 2010/0128517 A1 | 5/2010 | Bedeschi et al. | | |
| 2011/0286279 A1 | 11/2011 | Lei et al. | | |
| 2011/0292732 A1 | 12/2011 | Ha | | |
| 2012/0155180 A1 | 6/2012 | Kawamura et al. | | |

OTHER PUBLICATIONS

International Search Report and Written Opinion of the International Searching Authority for International Application No. PCT/US2013/052504, mailed Nov. 6, 2013.

* cited by examiner

*Primary Examiner* — Tan T. Nguyen
(74) *Attorney, Agent, or Firm* — Sterne, Kessler, Goldstein & Fox P.L.L.C.

(57) ABSTRACT

Systems and methods are provided to minimize write disturb conditions in an untargeted memory cell of a non-volatile memory array. Bitline driver circuits are provided to control a ramped voltage applied both to a bitline of a target memory cell and a neighboring bitline of an untargeted memory cell. Various embodiments advantageously maintain the integrity of data stored in the untargeted memory cells by applying a controlled voltage signal to a previously floating bitline of a neighbor cell to reduce a potential difference between the source and drain nodes of the untargeted neighbor memory cell during a write operation at a target memory cell. In another embodiment, an increased source bias voltage is applied on a "source" bitline of the target cell during the ramping of the drain bias voltage and then reduced to a ground or near ground potential during the write operation.

20 Claims, 13 Drawing Sheets

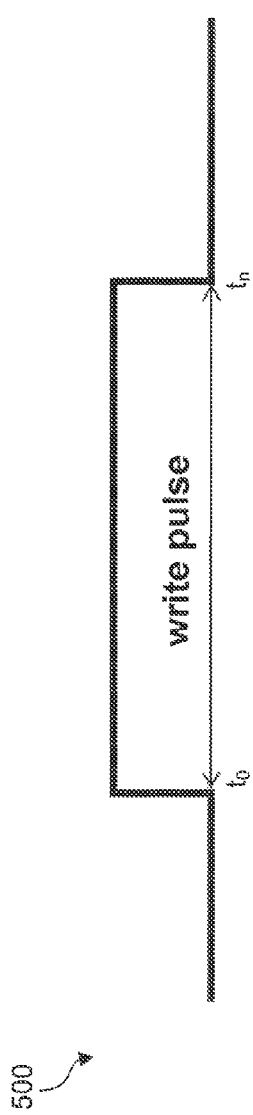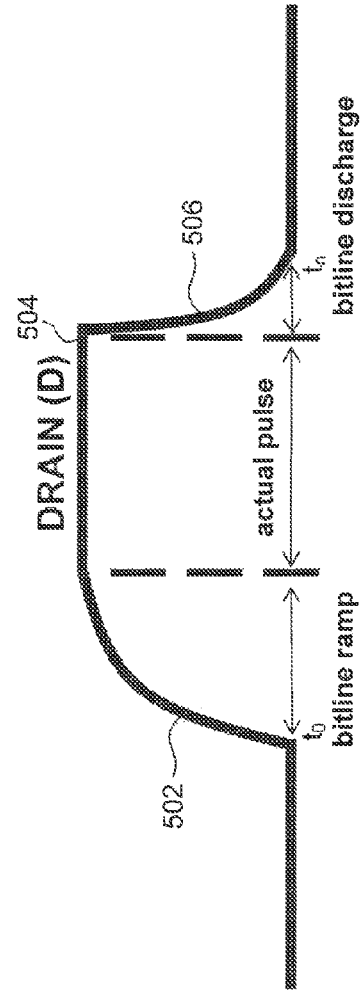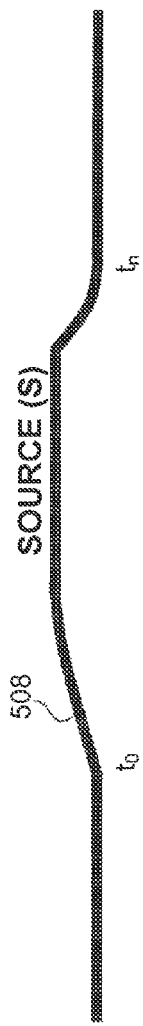

BITLINE VOLTAGE REGULATION IN NON-VOLATILE MEMORY

FIELD OF THE INVENTION

The present invention relates generally to non-volatile memory, and more particularly to minimizing write disturb effects in non-volatile memory by regulating voltages applied to a bitline of a target memory cell and a neighboring bitline of the same or adjacent memory cell during a write operation.

BACKGROUND

Advances in semiconductor manufacturing processes, digital system architecture, and wireless infrastructure, among other things, have resulted in a vast array of electronic products, particularly consumer products, that drive demand for ever-increasing performance and density in non-volatile memory. As with many aspects of the semiconductor industry, there is a continuing desire and effort to achieve higher device packing densities and to increase the number of memory cells on a single die, wafer, or semiconductor device. At the same time, increased device speed and performance are also desired.

Common non-volatile memory devices include a virtual ground memory array composed of many individual memory cells, each capable of storing one or more bits of data. Typical non-volatile memory architectures include a memory array comprised of individual charge storing transistor cells, typically of a floating-gate type transistor or a charge trapping layer transistor. In common array architectures, the memory cells are typically arranged in a grid of rows and columns. Traditionally, each transistor memory cell includes a gate, a source and a drain node. In some non-volatile memory, each memory cell in a row shares a common wordline connected to the gate of each cell. The array also includes a number of bitlines typically provided perpendicular to the wordline. Each bitline connects to a source/drain node of each memory cell of a column in the array, where neighboring cells share a bitline.

In many non-volatile memory devices, the memory array is organized into individually addressable units, groups or sectors, which are accessed for read, write and erase operations through address decoding circuitry. The non-volatile memory device usually includes appropriate decoding and group selection circuitry, and driver circuitry for providing appropriate voltages to the wordlines and bitlines of the cells being operated upon, as is well known in the art.

Some non-volatile memory, such as flash memory, are generally programed by hot electron injection and erased by Fowler-Nordheim tunneling. These mechanisms are typically performed by applying appropriate voltages to the gate, source and drain nodes of the targeted memory cell. During an erase or write operation, appropriate voltages are applied to the transistor nodes to cause charge to be removed from or stored onto the floating gate or the charge trapping layer of the targeted transistor cell. During a read operation, appropriate voltages are applied to the transistor nodes to cause a current to flow in the targeted cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The location of a targeted memory cell is identified according to the row and column of its position in the memory array. Peripheral circuitry receives addressing information and decoding circuitry is used to select the appropriate wordline and bitlines associated with the target cell.

To initiate a write operation at the target cell, a programming voltage is applied to the appropriate wordline coupled to the gate of the targeted transistor memory cell. Generally, only a bitline corresponding to a drain node of the selected target cell receives a drain bias program voltage, while the other bitline corresponding to the source node of the target cell receives a source bias voltage at or near ground potential. During the write operation, known circuits electrically decouple all other bitlines of neighboring nontargeted cells from a voltage source such that the bitlines are said to be "floating". Because the neighboring bitlines are floating, the neighboring memory cells in the same row ideally do not conduct a current and are not affected by the write operation at the target cell. However, the neighboring cells in the same row are in a resistive state due to the voltage applied at their gates by virtue of being connected to the same wordline as the target cell. Moreover, due to capacitive coupling between metal bitlines, a reverse potential difference can occur between the drain and source nodes of the neighbor cell resulting in an undesired write disturb on the untargeted neighbor cell. A write disturb is an unfortunate by-product of a high voltage applied to a bitline to change the state of a target memory cell.

In some memory arrays, capacitive coupling between a target bitline and a neighboring floating bitline as well as a bitline to bitline leakage current between the two, effectively "pull up" the voltage potential experienced on the neighboring "floating" bitline during a write operation to closely follow the drain bias voltage applied at the target cell bitline. Accordingly, any potential difference between the source and the drain nodes at the untargeted cell is a small value and thus the minimal current through the untargeted cell typically does not result in a severe write disturb condition at the untargeted cell. Additionally, some non-volatile memory devices control a ramp rate of the target bitline to enable a more effective "pull up" of the voltage potential at the floating bitline so that the potential difference between a target cell bitline and the neighboring floating bitline is reduced. This technique, however, is less effective in higher density memory arrays that have been demanded by the market.

Some non-volatile memory devices achieve higher density virtual ground memory arrays by reducing the physical dimensions of each of the transistor memory cells and adding more rows of cells to the array. Accordingly, the bitlines coupled to the source/drain nodes of the memory cells are positioned physically closer together and each bitline has an increased resistive value due to increased load and length. Thus, bitlines in higher density arrays exhibit an increased RC time constant which induces a delay in charging up the floating neighboring bitline. Due to this delay, the floating bitline voltage charges more slowly and does not closely follow the target bitline voltage during a write operation. Thus, an increased potential difference experienced between the source and drain nodes of the neighboring memory cell potentially causes a write condition at the untargeted neighboring cell resulting in severe and undesired write disturb effects. Moreover, transistors with smaller physical dimensions are more sensitive, thus even previously tolerated write conditions in the neighbor cell may result over time in severe disturbance to the charge and therefore data of the neighbor cell. Thus, as higher density and smaller die size structures are implemented in non-volatile memory devices, the write disturb problem becomes more severe and harder to handle.

What is needed is an apparatus and method for enabling write operations for a high density memory array at desirable performance speeds, while preserving the existing state of neighboring cells.

BRIEF DESCRIPTION OF THE DRAWINGS

Embodiments of the invention are described with reference to the accompanying drawings. In the drawings, like reference numbers indicate identical or functionally similar elements. Additionally, the left most digit(s) of a reference number identifies the drawing in which the reference number first appears.

FIGS. 5A, 5B, and 5C show illustrative voltage waveforms for a write pulse, a drain bias signal and a source bias signal, respectively.

Figure 1:
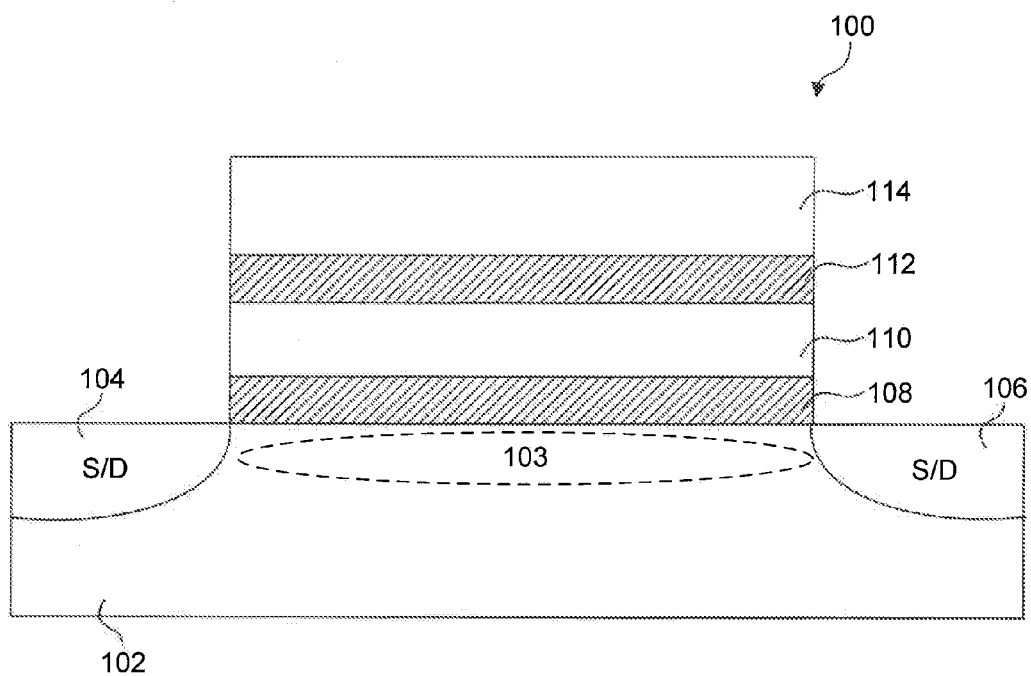
FIG. 1 is a cross-sectional representation of an n-channel floating gate field effect transistor used in a non-volatile memory array such as flash memory.

It is noted that the cross-sectional representations of various semiconductor structures shown in the figures are not necessarily drawn to scale, but rather, as is the practice in this field, drawn to promote a clear understanding of the structures, process steps, and operations which they are illustrating.

DETAILED DESCRIPTION

The following Detailed Description refers to accompanying drawings to illustrate exemplary embodiments consistent with the invention. References in the Detailed Description to "one exemplary embodiment," "an illustrative embodiment", "an exemplary embodiment," and so on, indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Terminology

The terms, chip, die, integrated circuit, semiconductor device, and microelectronic device, are often used interchangeably in the field of electronics. The present invention is applicable to all the above as these terms are generally understood in the field.

With respect to chips, it is common that power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips are commonly made by way of electrical conductors, those skilled in the art will appreciate that chips and other circuit elements may alternatively be coupled by way of optical, mechanical, magnetic, electrostatic, and electromagnetic interfaces.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

FET, as used herein, refers to a metal-oxide-semiconductor field effect transistor (MOSFET). An n-channel FET is referred to herein as an NFET. A p-channel FET is referred to herein as a PFET.

Floating gate transistor refers to a FET in which a stack is disposed over the channel region, where that stack has a first dielectric layer disposed over the channel region of the FET, a first electrically conductive material disposed over the first dielectric layer, a second dielectric layer disposed over the electrically conductive material, and a second electrically conductive material disposed over the second dielectric layer. The first dielectric layer is referred to herein as the floating gate dielectric layer. Historically, and less accurately, the first dielectric layer was referred to as the tunnel oxide. The first electrically conductive material is referred to as the floating gate. The second dielectric layer is referred to herein as the control gate dielectric layer. Historically, the second dielectric layer was referred to as the interpoly oxide, but this term is misleading for floating gate transistors having a high-k dielectric material as the second dielectric layer, and a control gate made of metal, metal alloy, or a stack of metals or metal alloys (HKMG). The second electrically conductive material is referred to as the control gate. In this arrangement the floating gate is electrically insulated from any other electrical node.

Source/drain (S/D) terminals refer to the terminals of a FET, between which conduction occurs under the influence of an electric field, subsequent to the inversion of the semiconductor surface under the influence of an electric field resulting from a voltage applied to the gate terminal of the FET. Generally, the source and drain terminals of a FET are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

High-k dielectric refers to a material that has a dielectric constant greater than that of silicon dioxide.

The terms contact and via, both refer to structures for electrical connection of conductors from different interconnect levels. These terms are sometimes used in the art to describe both an opening in an insulator in which the structure will be completed, and the completed structure itself. For purposes of this disclosure, contact and via both refer to the completed structure.

Substrate, as used herein, refers to the physical object that is the basic workpiece that is transformed by various process operations into the desired microelectronic configuration. A substrate may also be referred to as a wafer. Wafers, may be made of semiconducting, non-semiconducting, or combinations of semiconducting and non-semiconducting materials.

The term vertical, as used herein, means substantially perpendicular to the surface of a substrate.

Overview

One common non-volatile memory is the flash memory. A flash memory cell is typically formed from a floating gate transistor. In some embodiments, the flash memory cell may include a charge trapping layer instead of a floating gate for storing charge. Flash memory products generally include an array of flash memory cells.

In the flash memory it is common for a portion of the floating gate transistors in the array to be interconnected such that their control gates form a common node. That common node is referred to as a wordline. The wordline is driven by a wordline driver circuit, which may apply a voltage to the control gates, that voltage having a magnitude dependent on whether these memory cells have been addressed, and on whether an erase, program, or read operation is to be performed. Flash memory arrays typically include many wordlines.

Similarly, in the flash memory array it is common for a portion of the floating gate transistors in the array to be interconnected such that a source/drain terminal forms a common node. This common node is referred to as a bitline diffusion area, which is electrically connected to a preferably metal bitline. A bitline driver circuit may apply a voltage to the bitline, that voltage having a magnitude dependent on whether a memory cell connected to the bitline has been addressed, and on whether an erase, program, or read operation is to be performed. Flash memory arrays typically include many bitlines.

During an addressing or selecting operation of a target memory cell, it is known that accessing the desired memory cell(s) can unintentionally place electrons on, or remove electrons from, the floating gate or charge trapping layer of non-selected memory cells if those memory cells share a wordline and/or a bitline with the selected memory cells. In one particular example, during a write operation, a selected target memory cell is programmed, and a neighboring memory cell that shares a bitline and wordline may receive electrons onto its floating gate because of an inadvertent and undesired write condition, (i.e., high gate voltage and potential difference between source and drain nodes).

As explained in greater detail below, various embodiments of the present invention provide circuits and methods for reducing or minimizing write disturb conditions on untargeted neighboring cells, while providing increased write performance. Various embodiments advantageously maintain the integrity of data stored in the untargeted memory cells by applying a controlled voltage signal to a previously floating bitline of a neighbor cell to reduce a potential difference between the source and drain nodes of the untargeted neighbor memory cell. Not only is the potential difference across the nodes of an untargeted neighbor cell reduced, but higher write speeds can be realized at the targeted cell because the ramp rate of the neighboring bitline more quickly follows that of the target bitline, thereby enabling faster drain bias voltage ramp up of a target bitline.

In another embodiment, write speeds can be even further increased by also applying an increased source bias voltage on a "source" bitline of the target cell during the ramping of the drain bias voltage. In this manner, the drain bias voltage of the target cell more quickly achieves a voltage level sufficient for programming. Additionally, if there is a concurrent write operation to an adjacent memory cell, the increased source bias voltage applied at the adjacent memory cell may help ameliorate any pull-down effects on other bitlines in a same row. The pull-down effects are more detrimental when the source bias voltage is alternatively at or near ground voltage. As a result, the ramp rate of other bitlines can be more effectively controlled to minimize a potential difference between the source and drain nodes of an untargeted memory cell.

Figure 2:
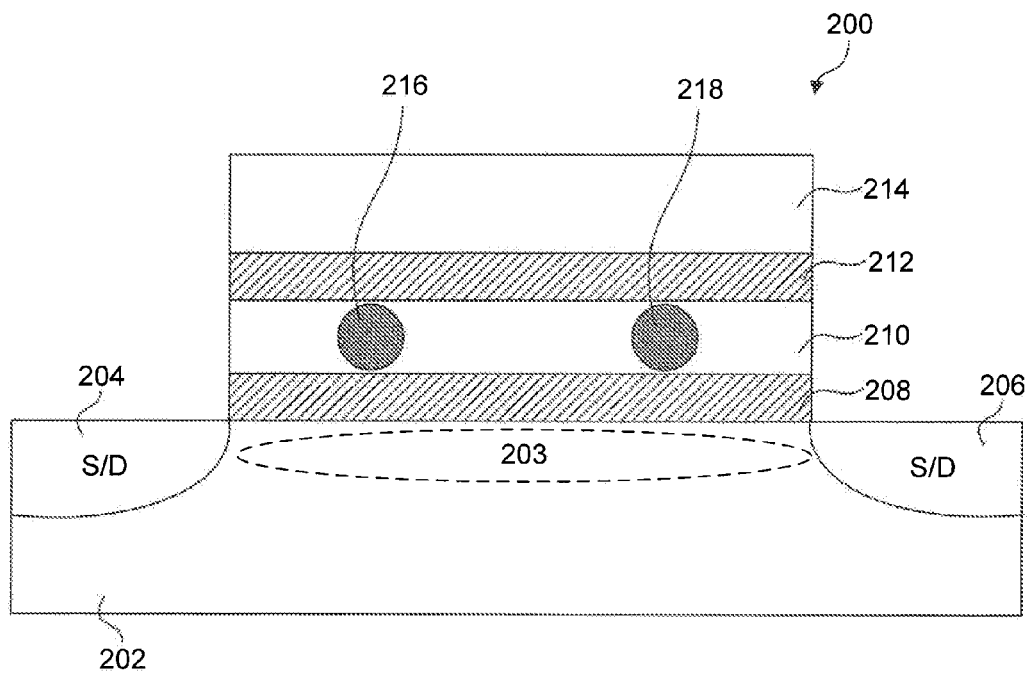
FIG. 2 is a cross-sectional representation of an n-channel charge trapping layer field effect transistor used in a non-volatile memory array such as flash memory.
Figure 3:
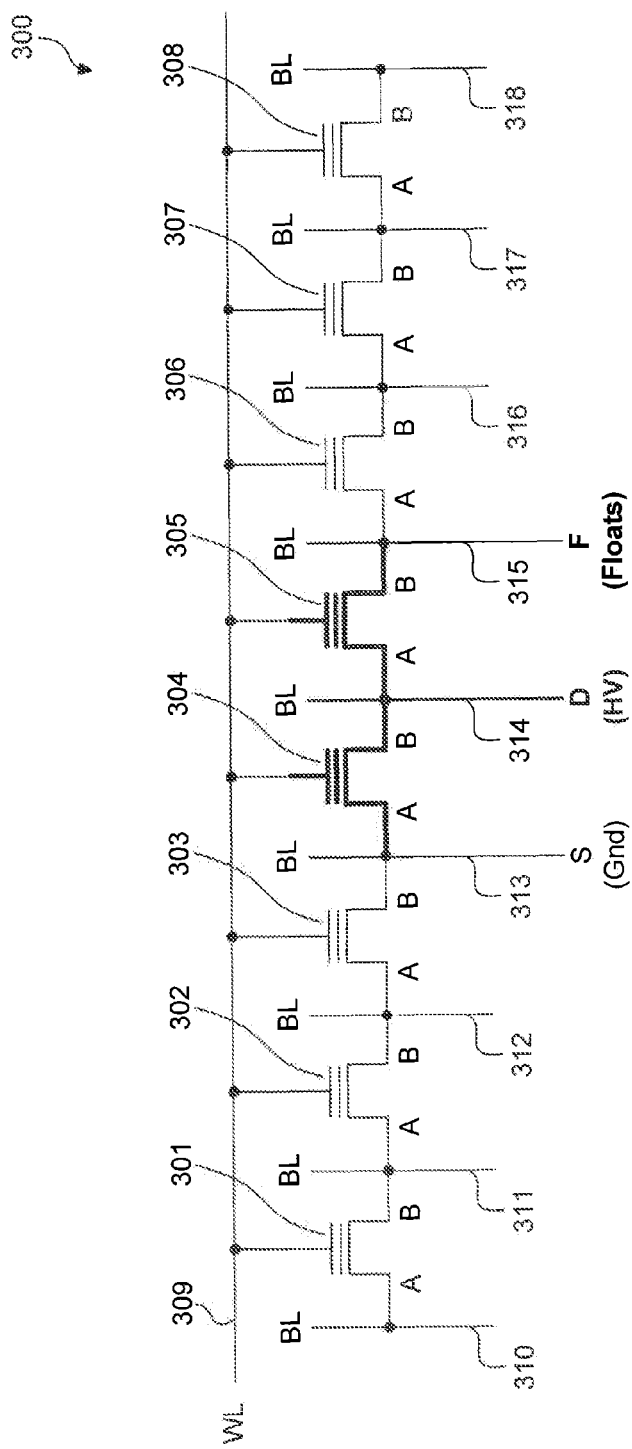
FIG. 3 is a schematic diagram of a partial row of transistor memory cells in an exemplary non-volatile virtual ground memory array.

FIGS. 1-3 provide background information.

FIG. 1 shows a cross-sectional representation of an illustrative n-channel floating gate field effect transistor 100 used in an exemplary non-volatile memory array such as a flash memory. A substrate 102, typically, but not limited to, a silicon wafer, has formed therein a pair of source/drain (S/D) terminals 104, 106. S/D terminals 104, 106 correspond to buried bitlines in substrate 102, or bitline diffusion areas which are electrically coupled to metal bitlines provided as part of the non-volatile memory array, as is well known in the art. For convenience, S/D terminal 104 is referred to as a source terminal and S/D terminal 106, a drain terminal. However, in any particular embodiment both S/D terminals 104, 106 may correspond to either a source terminal or a drain terminal of a transistor memory cell as determined by the layout or pattern of a non-volatile memory array, and may be interchangeable in an exemplary embodiment according to desired operation. That portion of substrate 102 laterally disposed between source 104 and drain 106 is referred to herein as a channel region 103. As can be seen in FIG. 1, source 104 and drain 106 are aligned to a stack that includes a gate dielectric layer 108, a floating gate 110, a dielectric layer 112, and a control gate 114. Control gate 114 is formed as part of a wordline in the memory array or is electrically coupled to a wordline in the array. Floating gate 110 is electrically insulated from the channel region 103 by gate dielectric layer 108, and is electrically insulated from control gate 114 by dielectric layer 112. A threshold voltage $V_T$ of floating gate transistor 100 can be modified by increasing or decreasing the amount of charge stored on floating gate 110. The amount of charge injected onto floating gate 110 can correspond to two bits of data (either '0' or '1') based on whether the device 100 is conducting a current above a certain threshold when a read voltage is applied to gate 114. The amount of charge on a floating gate changes an operating characteristic of the transistor referred to as a threshold voltage or $V_T$. During operation, specific or constant $V_T$ values are desired to maintain to ensure accurate storage of data values. Alternatively, floating gate transistor 100 can be configured to store multiple bits of data determined according to varying current values sensed when a read voltage is applied to gate 114. Varying current values can be achieved by precisely controlling the amount of charge stored on the floating gate 110 or $V_T$ during a write operation. In such multiple bit configurations, data stored in floating gate transistor cell 100 is even more vulnerable to write disturb conditions because of greater precision necessary to accurately measure corresponding charge associated with the stored data. In such an embodiment, even slight variations in the stored charge and therefore $V_T$ can result in undesirable corruption of the stored data.

Electrons are typically placed on the floating gate by hot electron injection, and removed by tunneling, such as Fowler-Nordheim tunneling. By convention, removing electrons is referred to as erasing, and adding electrons is referred to as programming. Those skilled in the art will recognize that FIG. 1 is illustrative only, and that other device structures that implement the functionality of the illustrated floating gate transistor are possible. By way of example, and not limitation, the control gate may wrap around the vertical sides of the floating gate, with both gates separated by a dielectric material. By way of further example, and not limitation, dielectric layer 112 and control gate 114 may be comprised respectively of a high-k dielectric material and a metal, metal alloy, or stack of metals and/or metal alloys.

With reference to the structure of FIG. 1, a program or write operation on transistor memory cell 100 is performed by causing electrons from channel region 103 to be injected onto floating gate 110. To program floating gate transistor 100, a source bias voltage is applied to source terminal 104, a control gate voltage is applied to control gate 114, and a drain bias voltage is applied to drain 106 such that both the "gate-to-source" voltage and the "drain-to-source" voltage are predetermined positive values. This arrangement causes electrons to be accelerated in channel region 103 between source 104 and drain 106 under the influence of the drain-to-source electric field. The accelerated electrons become sufficiently energetic as they approach the drain region that some of them have enough energy, after a collision with one or more atoms in the crystal lattice of channel region 103, to pass through floating gate dielectric layer 108 and become trapped in floating gate 110. The increased amount of negative charge on floating gate 110 makes the threshold voltage $V_T$ of floating gate transistor 100 higher, i.e., requiring a higher control gate-to-source voltage to turn on.

FIG. 2 shows a cross-sectional representation of an illustrative n-channel charge trapping layer field effect transistor 200 used in an exemplary non-volatile memory array such as a flash memory. Similar to floating gate transistor 100 of FIG. 1, charge trapping layer transistor 200, includes a substrate 202, which has formed therein a pair of source/drain (S/D) terminals or bitline diffusions 204, 206. That portion of substrate 202 laterally disposed between S/D 204 and S/D 206 is referred to herein as a channel region 203. As shown in FIG. 2, S/D 204 and S/D 206 are aligned to a stack that includes a gate dielectric layer 208, a charge trapping layer 210, a dielectric layer 212, and a control gate 214. Charge trapping layer 210 is electrically insulated from the channel region 203 by gate dielectric layer 208, and is electrically insulated from control gate 214 by dielectric layer 212. Charge trapping layer 210 is configured with two charge storage areas 216 and 218, for example, each capable of storing one or more bits of data.

Programming or writing data to charge trapping layer transistor 200 is similar to that of floating gate transistor 100. Electrons are injected into charge trapping layer 210 by applying a high electric field between an acting source and acting drain of charge trapping layer transistor 200. To program left charge storage area 216, a drain bias voltage is applied to acting drain 204 and a source bias voltage is applied to acting source 206. Conversely, to program right storage area 218, a drain bias voltage is applied to acting drain 206 and a source bias voltage is applied to acting source 204. Charge trapping layer 210 is preferably constructed of a low conductivity material so that any trapped electrons tend to stay generally localized in the area 216 or 218 in which they are injected. Charge storage areas 216 and 218 are generally located near the edges of the charge trapping layer because the probability of an electron being injected into the charge trapping layer is at a maximum near the acting drain terminal 204, 206. It is in these areas where the electrons will have gained the greatest energy under the applied electric field during a write operation to be injected into the charge trapping layer 210. Such a configuration enables the charge trapping layer 210 to store one or more bits of data in each charge storage area 216 and 218.

FIG. 3 illustrates a partial row 300 of an array of non-volatile memory cells such as a floating gate transistor or charge trapping layer transistor in accordance with an exemplary embodiment of the present invention. Partial row 300 shows a group of memory cells 301-308 in a NOR virtual ground type implementation. The partial row 300 is a virtual ground implementation because there are no dedicated ground bitlines. Rather, each of the bitlines may be driven to a ground or near ground potential by an applied voltage, as desired according to a particular operation. Memory cells 301 through 308 are connected to a common wordline WL 309, which is electrically connected to a control gate of each of the transistor memory cells 301-308. As shown, each transistor memory cell is electrically coupled to a pair of metal bitlines BL, designated 310-318. Each metal bitline 310-318 is electrically coupled to one of a S/D terminal of each corresponding memory cell 301-308. These S/D terminals may alternately be referred to as bitline diffusion areas. As shown, adjacent pairs of the memory cells share a common bitline. For example, memory cell 301 has associated bitlines BL 310 and BL 311, and memory cell 302 has associated bitlines BL 311 and BL 312. As such, cells 301 and 302 share bitline BL 311.

Depending upon applied wordline voltages and bitline connections, memory cells 301-308 are capable of writing, reading, and erasing bits corresponding to a charge value stored on floating gate 110 or within charge storage area 216 or 218 of charge trapping layer 210. In an exemplary virtual ground memory array, desired performance can be met by achieving high write speeds to a target memory cell 304, for example, while preserving the existing state of the neighboring cells, 301-303 and 305-308. Additionally, it is desirable to keep the array design and peripheral circuitry as compact and manageable as possible.

A fast write speed can be achieved by the application of an increased electric field to the target memory cell during a write operation. The electric field is applied by providing predetermined voltage values at the gate, drain, and source terminals of a targeted memory cell to create an increased potential difference between the source and drain terminals of the targeted memory cell. To enable an efficient write operation at a target cell, a particular potential difference must be achieved. The required potential difference between the source and drain terminals of a particular memory cell is determined by the semiconductor technology as well as a programming or charge state of the cell. During a write operation on target memory cell 304, a sufficient electric field is typically achieved by providing a high voltage potential on wordline WL 309 coupled to the gate of target cell 304, a high voltage potential to bitline 314 corresponding to the active drain terminal of target cell 304, and providing a voltage potential at or near ground level on bitline 313 corresponding to the source terminal of target memory cell 304. The faster a voltage potential applied to bitline 314 reaches a sufficient programming potential, the faster the write operation is performed on target cell 304. However, bitline 314 should not charge too quickly so as to create a potential difference between target bitline 314 and floating bitline 315. Thus, the performance of the write operation is determined in part by semiconductor technology and how quickly the floating bitline 315 can be pulled up or charge up to minimize the potential difference. In some embodiments, the high drain bias voltage potential applied to bitline 314 is provided with a stepped or ramped waveform. Such a ramped voltage waveform voltage enables floating bitline 315 to ramp up or charge at a rate to more closely follow the waveform of active bitline 314.

Ramp up behavior of floating bitline 315 is determined by several factors. One of the major contributors is the bitline to bitline leakage current which causes floating bitline 315 to charge up. Another contributor is metal to metal capacitive coupling between bitlines 314 and 315. These contributors commonly were sufficient to pull up the voltage potential on the floating bitline 315 such that a reverse potential difference between a source and drain of the untargeted cell 305 does not result in a severe write disturb condition on the untargeted cell 305. In higher density memory arrays in which transistor memory cells are constructed with shorter gate and channel lengths, a resultant bitline leakage current may be relatively high compared to less dense arrays. However, as discussed above, in higher density memory arrays, each of the bitlines have a greater resistance due to increasing length and excessive loading on the bitlines. Therefore, because of the increased RC time constant, the adjacent floating bitline 315 exhibits a much slower charge rate or ramping rate than in a less dense array. Accordingly, even in embodiments in which a ramped drain bias voltage is applied to bitline 314, metal to metal bitline capacitive coupling and bitline to bitline leakage induced pull up effects on the adjacent floating bitline 315 are ineffective in pulling up the potential on the neighboring bitline 315 to closely follow the drain bias potential on the active bitline 314 resulting in a write disturb at the untargeted cell 305.

For example, this side effect is caused by the floating bitline "F" 315 and its slow capacitive coupling up/down behavior with respect to the high voltage (HV) driven bitline "D" 314, while the rising or falling transition of bitline D 314 is in progress and the source bitline "S" 313 is nominally close to ground (Gnd) potential. Because a high voltage is applied at the wordline 309, if the coupling behavior of a floating bitline 315 next to a fast ramping metal bitline 314 is not as fast to respond to its neighbor's potential change over time $\Delta t$ (i.e. $\Delta V/\Delta t$), a reverse potential difference between bitlines 314 and 315 results in an undesired write stimulus to the neighbor cell 305.

In non-volatile memory devices, existing power supplies comprising charge pumps and regulators, for example, are designed to meet the high write speed demanded by applications utilizing the memory device. However, the write speed of a target cell in a high density memory array is limited by the ramping behavior of an adjacent bitline so as to minimize write disturb conditions. As discussed above, one technique for minimizing the potential difference between an active bitline and a floating bitline is to implement ramp rate control of the voltage applied on the active bitline so as to enable the floating bitline ramp rate to more closely follow the active bitline ramp rate. However, in order to realize higher density memory arrays, providing ramp rate control only for the driven bitline of a target cell may not be sufficient to prevent write disturb errors.

Exemplary embodiments of the present invention mitigate this problem by actively controlling the ramp rate of not only the target bitlines but also the neighboring bitline of an untargeted memory cell while writing to a targeted memory cell. In another embodiment, ramp rate control for the target bitline and a neighbor floating bitline is improved by applying source terminal voltage control of targeted cells in the memory array during a write operation. Each of these methods may be employed independently or in combination depending on the data pattern of the memory array or other performance requirements of the non-volatile memory.

Illustrative Embodiment

Figure 4:
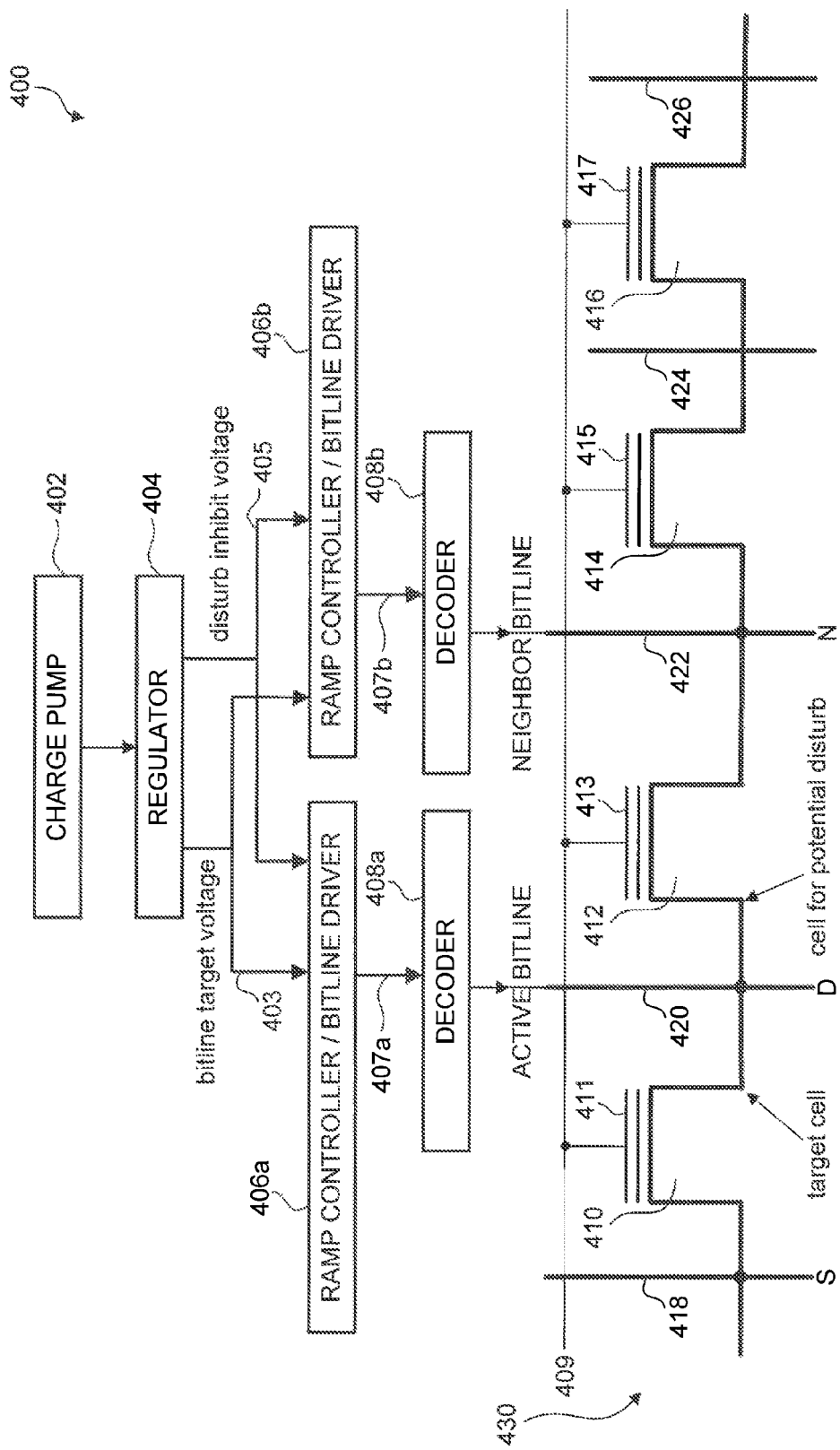
FIG. 4 is a schematic block diagram of the general system structure of an exemplary embodiment of the present invention.

FIG. 4 depicts an illustrative embodiment of the present invention. A non-volatile memory device 400 includes a charge pump circuit 402, a voltage regulator circuit 404, a first ramp controller/bitline driver 406a and a second ramp controller/bitline driver 406b.

Charge pump 402 generates an unregulated high voltage from a power supply (not shown) electrically connected to non-volatile memory device 400, as is well-known in the art. Regulator circuit 404 generates a regulated bitline target voltage signal 403 and a regulated disturb inhibit voltage signal 405. Bitline target voltage signal 403 is the high voltage signal to be applied to a bitline of a target or active memory cell during a write operation, whereas disturb inhibit voltage signal 405 is the high voltage signal to be applied to a neighboring bitline of an untargeted cell during a write operation to reduce or eliminate the occurrence of a write disturb condition on the untargeted neighbor cell.

As shown in FIG. 4, a pair of ramp controller/bitline driver circuits 406a and 406b are provided to control both the ramp rate of the bitline target voltage signal 403 and the ramp rate of the disturb inhibit voltage signal 405 and to output a ramped bitline target voltage signal 407a and a ramped disturb inhibit voltage signal 407b. Ramp controller/bitline drivers 406a and 406b provide respective ramped voltage signals with a predetermined or controlled ramping profile to bitline decoding circuitry 408a and 408b, respectively, which enable selection and activation of the appropriate bitlines in the memory array. Bitline decoding circuitry 408a and 408b include address decoding circuitry to pass the correct high voltage signals to the respective bitlines while performing the write operation, as is well understood in the art.

In the exemplary embodiments, reference to a neighboring bitline refers to a bitline of an untargeted memory cell that is conventionally a floating bitline. In the exemplary embodiments, the neighboring bitline of an untargeted cell is driven with a ramped voltage signal to mitigate write disturb errors at the untargeted cell. The neighboring bitline of an untargeted cell may refer to a bitline of an untargeted cell that shares a bitline with the targeted cell or another neighboring cell in the array that may be adversely affected with a write disturb error. The neighboring bitline need not refer to only a bitline of an adjacent cell with which the targeted cell shares a bitline.

FIG. 4 illustrates a partial row of a memory array 430 according to an exemplary embodiment of the present invention. As shown, memory array 430 includes a plurality of transistor memory cells 410, 412, 414, 416 each connected at their gate electrodes 411, 413, 415, 417, respectively, to a common wordline 409. Memory array 430 also includes a plurality of bitlines 418, 420, 422, 424, 426. Bitlines 418 and 420 are electrically connected to an S/D terminal of memory cell 410. Bitlines 420 and 422 are electrically connected to an SD terminal of memory cell 412. Bitlines 422 and 424 are electrically connected to an S/D terminal of memory cell 414 and bitlines 424 and 426 are electrically connected to an S/D terminal of memory cell 416.

In an exemplary embodiment, memory cell 410 is designated as a target cell for a write operation. Upon address decoding of target memory cell 410, an appropriate wordline 409 and active bitline 420 are selected or enabled corresponding to target memory cell 410. Additionally, bitline decoding circuitry 408a and 408b selects or enables an appropriate neighbor bitline 422 of a neighboring cell 412 that is at risk of write-disturb during the write operation at the target memory cell 410. Bitline decoding circuitry 408a and 408b are configured to pass input voltage signals 407a and 407b to the selected or enabled bitlines, as is well understood in the art.

A write operation according to an exemplary embodiment is enabled according to a write pulse 500 as shown in FIG. 5A. Simplified waveform diagrams of voltage signals applied to a target memory cell during a write pulse 500 are shown in FIGS. 5B and 5C. For example, a programming voltage is applied to wordline 409 throughout an entire write pulse 500. As depicted in FIG. 5B, a drain bias voltage at a target bitline for the duration of the write pulse includes a bitline ramping stage 502, an actual pulse stage 504 and a bitline discharge stage 506. It is during bitline ramping stage 502 that a target bitline ramps up or charges up to reach a desired programming voltage bias, at which point the voltage bias levels off during the period referred to as the actual pulse stage 504. The voltage waveform shown in FIG. 5B is by example only.

Figure 7:
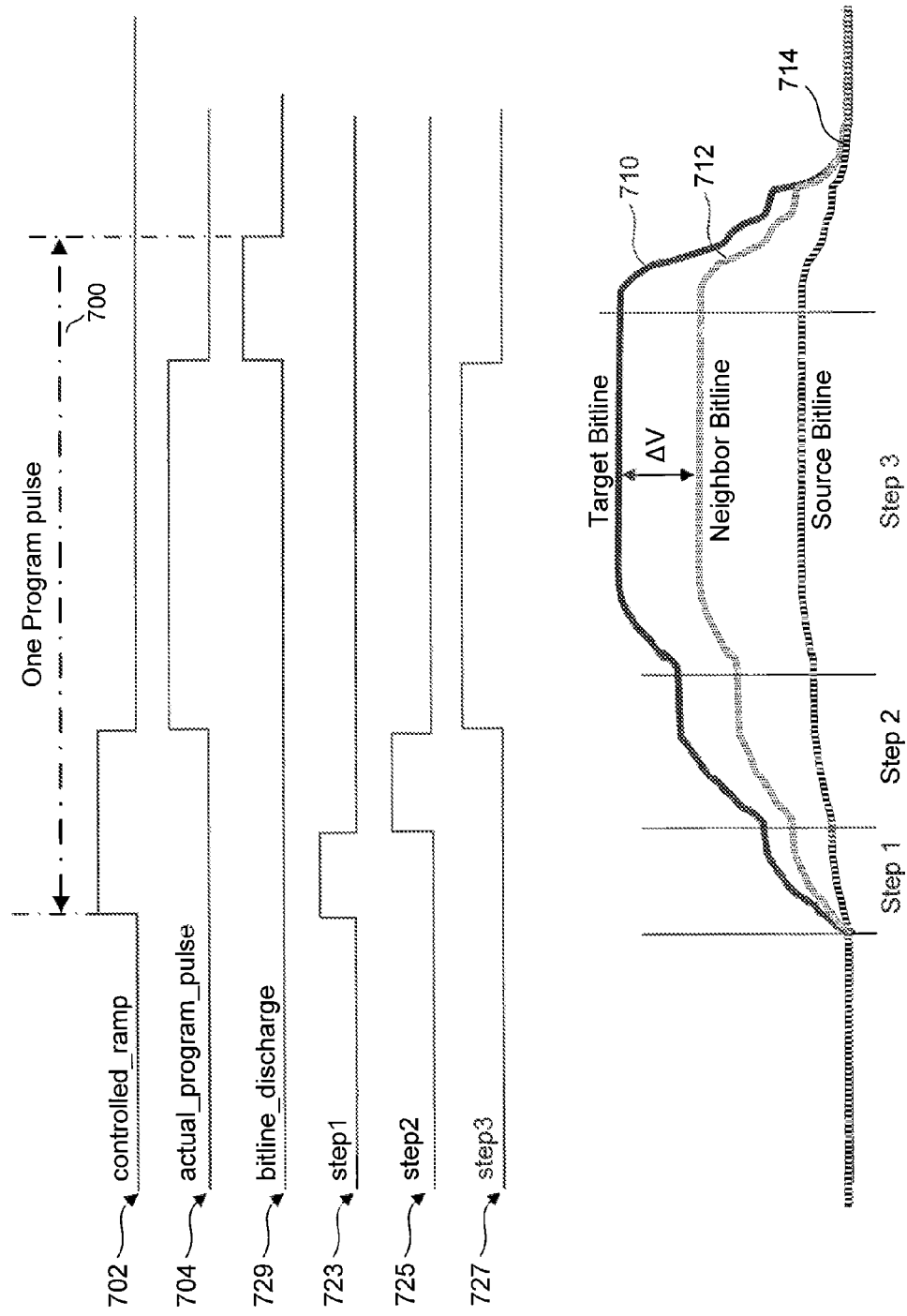
FIG. 7 is a timing diagram illustrative various digital control signals and the corresponding voltage waveforms on the bitlines of interest.

In an exemplary embodiment the drain bias signal includes a waveform consisting of multiple steps or ramps, particularly during bitline ramping stage 502, as shown in FIG. 7 discussed further below. It is during the actual pulse stage 504 in which an electric field created by a potential difference between a drain bias voltage and a source bias voltage is sufficient to inject the desired number of electrons onto the transistor memory cell's floating gate or charge trapping layer, for example. The duration of the actual pulse stage 504 is adaptively controlled according to transistor memory cell technology and the desired amount of charge to be added to the transistor memory cell. As shown in FIG. 5C, in an exemplary embodiment, a source bias voltage 508 also has a transient stage where it ramps up to a desired programming voltage at or near ground level during the actual pulse stage 504 of the drain bias voltage signal, so that the potential difference between the drain bias voltage and the source bias voltage remains substantially constant during the actual pulse stage 504.

Returning to FIG. 4, in an exemplary embodiment, a ramped bitline target voltage signal 407a is output from ramp controller/bitline driver 406a to bitline decoding circuitry 408a which has a selected or enabled output path to bitline 420 of target cell 410. Bitline target voltage signal 407a corresponds to a drain bias potential for an "active drain" node of target cell 410. Concurrently, a controlled source bias voltage regulator (not shown) provides a source bias voltage to bitline 418 corresponding to a "source" node of target cell 410. In this exemplary embodiment, ramped disturb inhibit voltage signal 407b is applied to a neighboring bitline 422 of an untargeted neighboring cell 412 throughout an entire write pulse 500. Ramped disturb inhibit voltage signal 407b is generated to include a waveform similar to the waveform of ramped bitline target voltage signal 407a. Ramped disturb inhibit voltage signal 407b is applied to neighbor bitline 422 throughout an entire write pulse of target memory cell 410, in similar manner as the ramped bitline target voltage signal 407a. Disturb inhibit voltage signal 407b is of a smaller potential than that of the bitline target voltage signal 407a, so that an additional disturb condition on untargeted memory cell 414 is not created by the voltage applied to bitline 422.

Untargeted memory cell 412 can experience a reverse potential difference between its acting drain and source terminals during the write operation of target cell 410, without experiencing a serious write-disturb condition. The tolerable potential difference across untargeted memory cell 412 is determined in part by the underlying semiconductor technology and a programming state of the untargeted memory cell 412. Because the programming state of each neighboring memory cell in a memory array may be difficult to determine prior to each write operation, in one embodiment the tolerable potential difference across an untargeted memory cell is preferably determined according to the smallest difference tolerable regardless of the programmed state of the untargeted cells. Accordingly, ramped disturb inhibit voltage signal 407b may be generated so that an experienced potential difference is no larger than a tolerable potential difference.

As shown in FIG. 4, an exemplary embodiment of the present invention generates at least two regulated high voltage signals, the bitline target voltage signal 403 and the disturb inhibit voltage signal 405. In an exemplary embodiment, it is advantageous to provide a separate ramp rate control for the neighboring bitline drivers independent from the active bitline drivers' ramp rate control so that the ramped bitline target voltage signal 407a applied to active bitline 420 and ramped disturb inhibit voltage signal 407b applied to neighbor bitline 422 are independently controllable. In this embodiment, the voltage signals applied to active bitline 420 and neighboring bitline 422 are adaptively controlled depending on the neighboring cell's sensitivity to a write disturb. Additionally, the potential value of the ramped disturb inhibit voltage signal 407b applied to neighboring bitline 422 can be adaptively controlled according to a magnitude of the bitline to bitline leakage expected in the neighboring cell as a function of the charge stored in the neighboring cell 412, as well as any other pull-up or pull-down effects which may be seen on neighboring bitline 422 as a result of the programmed states of the neighboring cells (e.g., 414, 416), and concurrent write operations on other cells in the array.

In some embodiments that enable independent ramp rate control for active bitline 420 and neighbor bitline 422, the potential difference between active bitline 420 and neighbor bitline 422 can be adjustable to a finer or larger resolution as desired. For example, where greater errors can be tolerated in a particular cell or corrected using known soft programming or error correction techniques, the potential difference between active target and neighboring bitlines 420 and 422, respectively, need not be precisely controlled. However, in multi-bit memory cells where even small changes in a stored charge can change the state of an untargeted memory cell, the potential difference between active target and neighboring bitlines 420, 422 can be more precisely tuned to a finer resolution.

Figure 6:
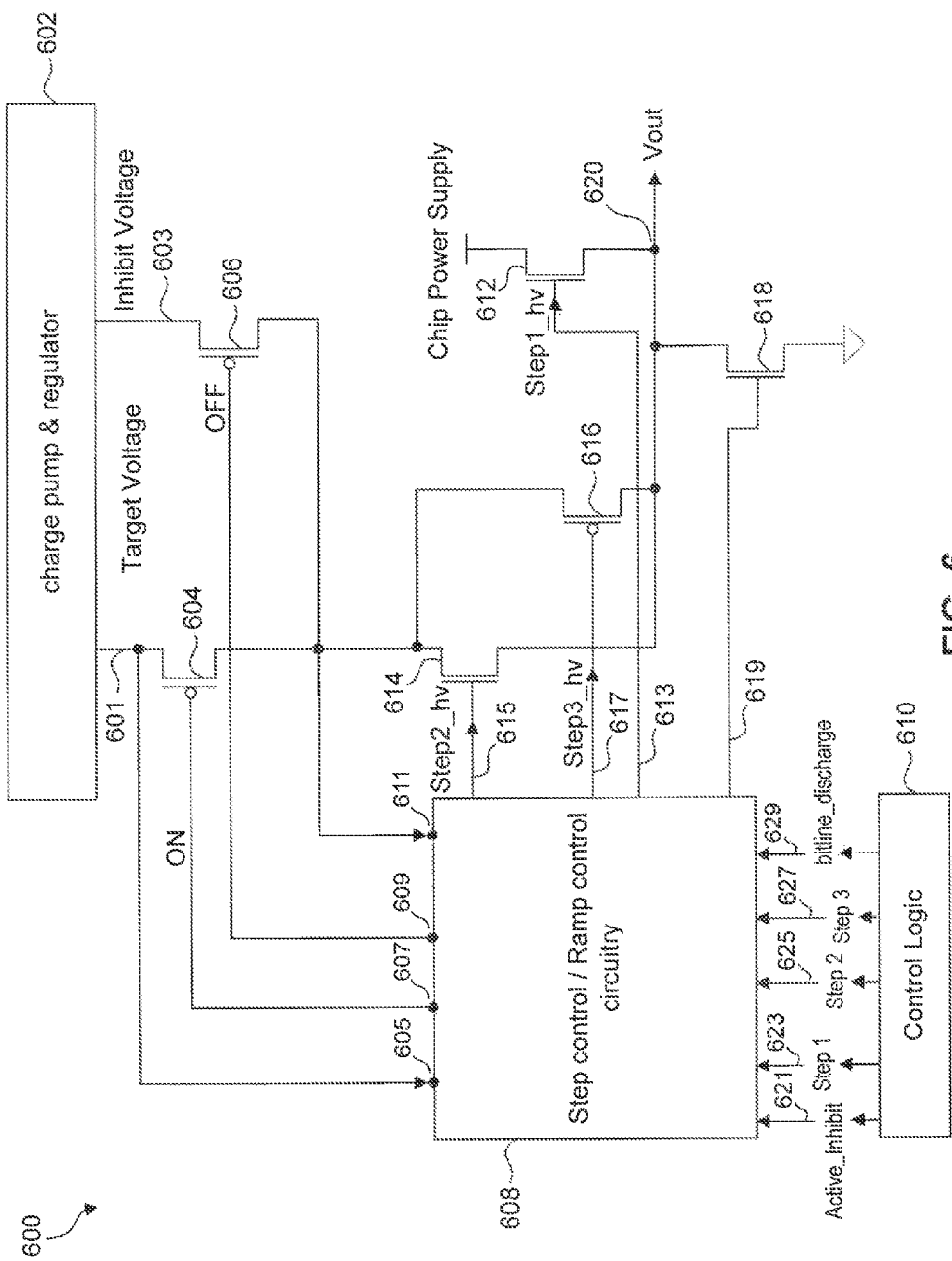
FIG. 6 is a schematic diagram of a bitline driver circuit for controlling a target bitline voltage and a neighboring bitline voltage in an exemplary embodiment of the present invention.

FIG. 6 shows a detailed diagram of an illustrative bitline driver circuit 600 that can be controlled to drive either an "active" target bitline or a "neighboring" bitline. Driver circuit 600 receives a bitline target voltage signal at a first output 601 from charge pump and regulator circuitry 602, and a disturb inhibit voltage signal at a second output 603 from charge pump and regulator circuitry 602. Output 601, corresponding to a target bitline voltage, is electrically connected to a first PFET 604 while output 603, corresponding to a disturb inhibit voltage, is electrically connected to a second PFET 606. PFETs 604 and 606 function as voltage controlled switches to pass the regulated bitline target voltage and regulated disturb inhibit voltage, respectively, from charge pump and regulator circuitry 602 when selectively enabled by a control signal applied at their respective gate electrodes. A control logic block 610 provides various control signals for the desired operation of bitline driver circuit 600, such as an Active_Inhibit signal 621, step control signals 623, 625, 627 and a bitline_discharge signal 629. Bitline driver circuit 600 further includes step control/ramp control circuitry 608, which includes a plurality of inputs and outputs for effectively controlling the ramping rate of output voltage signal Vout 620. Output voltage signal 620 is then applied to a selected bitline of a memory array. Step control/ramp control circuitry 608 receives a plurality of enabling signals from control logic block 610 for generating the appropriate ramped voltage signal Vout 620. Ramp control circuitry 608 receives a regulated target voltage signal at input 605 and a voltage signal from PFETs 604 or 606 through input 611. These voltage values aid ramp control circuitry 608 to effectively control a step or ramp rate of the output voltage signal 620.

As shown in FIG. 6, an Active_Inhibit logic signal 621 is provided to ramp control circuitry 608 for enabling selection of either a bitline target voltage or a disturb inhibit voltage to be passed from charge pump and regulator circuitry 602. While the Active_Inhibit logic signal 621 is asserted, a control signal output from terminal 607 is output to turn on PFET 604. In such an operation, bitline driver circuit 600 is configured to provide as Vout, a ramped target bitline voltage signal. While Active_Inhibit logic signal 621 is deasserted, a control signal is output from terminal 609 to turn on PFET 606. In this operation, bitline driver circuit 600 is configured to provide as Vout, a ramped disturb inhibit voltage signal. The ramped disturb inhibit voltage is applied to a neighboring bitline of an untargeted cell during a write operation at a target cell. In an exemplary embodiment, only one of PFET 604 and 606 will be turned on during a write operation.

The voltage signals generated by charge pump and regulator circuit 602 are closely regulated to a desired voltage level for the particular operation of the device. Because a target bitline voltage signal and a disturb inhibit voltage signal are offset by a predetermined voltage difference, charge pump and regulator circuit 602 generates at least two independent voltage signals which are applied to first and second outputs 601, 603. In this embodiment, bitline driver circuit 600 is advantageously operated to control either a target bitline voltage or a neighbor bitline voltage according to desired operation. As shown in FIG. 4, it is advantageous to provide multiple driver circuits 406a, 406b, to concurrently control an active bitline voltage and a neighbor bitline voltage during a write operation.

Ramp control circuitry 608 is configured to control the waveform of voltage signal 620 output from bitline driver circuit 600 to consist of several ramps or steps. By example only, bitline driver circuit 600 is configured to output a bitline driver voltage signal consisting of up to three steps or ramps. It should be understood by one having skill in the art that bitline driver circuit 600 can be modified to generate an output signal consisting of any number of desired steps or ramps. Moreover, the signal waveform of the output ramped signal, and particularly each step, need not be uniform and can be configured in any manner as desired to achieve optimum performance.

Ramp control circuitry 608 is configured to receive multiple inputs from control logic 610 which enable selection of an output ramping signal at output 613, 615 and 617, corresponding to a particular step or ramp, as desired. For example, control logic 610 may apply a logic signal at output 623, 625 or 627 to enable ramp control circuitry to effect a first step control, a second step control, and a third step control, respectively.

FIG. 7 is a timing diagram of the logic control signals and sample output voltage signals, both according to an exemplary embodiment. Voltage signal 710 corresponds to a target bitline voltage, signal 712 corresponds to neighboring bitline voltage, and signal 714 corresponds to a source bitline voltage.

As shown, a program pulse 700 during a write operation includes a controlled_ramp stage 702 in which the applied bitline voltage 710, 712 is ramping up to a desired programming voltage, an actual_program_pulse stage 704 in which the applied bitline voltage 710, 712 reaches the programming voltage, and a bitline_discharge stage 706 in which the applied bitline voltages 710,712 are discharged from the targeted and neighboring bitlines following completion of a write or programming operation. Referring to FIGS. 6 and 7, a control signal 623 for step 1 is enabled for a predetermined time period during controlled ramp stage 702. During this period of time, a first step control signal is output from ramp control circuitry 608 at output 613. Following the predetermined time period, control signal 623 is disabled and a control signal 625 for step 2 is then applied. While control signal 625 is enabled, a second step control signal is output from control circuitry 608 at output 615. In this example, control signals 623 and 625 are output during a controlled_ramp stage 702 and correspond to step 1 723 and step 2 725. Once again, after a predetermined period of time corresponding to step 2 has elapsed, control signal 625 is deasserted and control signal 627 is enabled. While control signal 627 is enabled, a third step control signal is output from ramp control circuitry 608 at output 617. During step 3, shown as 725, output voltage signal 620 has reached a target voltage value for the write operation, and thus it substantially coincides with actual_program_pulse stage 704, as shown in the timing diagram of FIG. 7. At the end of a predetermined time period necessary for effectively completing a write operation, control signal 627 is deasserted, as shown, while the bitline_discharge stage 704 of program pulse 700 is completed in accordance with bitline_discharge control signal 629. During bitline discharge, control signal 629 indicates to ramp control circuitry 608 to provide a voltage signal 619 to discharge transistor 618 to control a discharge rate of output voltage signal 620.

As shown in FIG. 6, ramp control circuit output 613, corresponding to a first step control signal step1_hv is connected to a gate of transistor 612, which is connected to an on-chip or external power supply (not shown). During a write operation program pulse, upon receipt of control logic signal 623 corresponding to "step 1", ramp control circuitry 608 provides a voltage control signal at output 613. Ramp control circuitry 608 provides a particular voltage control signal at output 613 to control conductivity of transistor 612 for effecting a desired output voltage signal 620, supplied to a selected bitline of a memory array.

After a predetermined period of time, control logic 610 generates and outputs a logic signal 625 corresponding to "step 2" to enable generation of a second ramp or step at output voltage signal 620. Upon receipt of logic signal 625, ramp control circuitry 608 provides a voltage control signal at output 615 which is connected to a gate terminal of a transistor 614. Transistor 614 is connected to either a target bitline voltage signal or a disturb inhibit voltage signal depending on operation of transistors 604 and 606 as controlled by Active_Inhibit control signal 621, discussed above. In an operation to control a target cell's bitline voltage, transistor 614 receives a bitline target voltage from charge pump and regulator circuitry 602 at output 601. Voltage control signal 615 is generated by ramp control circuitry 608 to control conductivity of transistor 614 for effecting a desired output voltage signal 620, supplied to a selected bitline of a target cell of a memory array.

As discussed with respect to FIG. 7, after a period of time corresponding to "step 2" 725 has lapsed, control logic 610 generates and outputs logic signal 627 corresponding to "step 3" 727 and actual_program_pulse stage 704 of the write operation program pulse 700. As shown in FIG. 6, ramp control circuitry 608 generates a control signal 617 which is applied to a gate terminal of transistor 616. Transistor 616 is preferably a PFET such that upon application of control signal 617 at its gate, it functions to pass a regulated target voltage generated by charge pump and regulator circuitry 602 and output at output 601. Transistors 612, 614, 616 are controlled so that only one is turned on at a time. Because transistors 604 and 606 function to pass the regulated voltage signal output from charge pump and regulator circuitry 602 as the output voltage signal 620, the target voltage signal is precisely regulated by charge pump and regulator circuitry 602 to meet technology and operation demands of an exemplary memory device. Upon completion of a write operation, output voltage signal 620 is discharged through transistor 618 which is activated or conducts upon application of control signal 619 at a gate terminal of transistor 618.

Bitline driver circuit 600 is discussed above with respect to providing an output voltage 620 to an active target bitline, such as bitline 420 shown in FIG. 4. However, as discussed above, bitline driver 600 may easily be configured to provide an output voltage 620 to a neighboring bitline of an untargeted cell, such as bitline 422 shown in FIG. 4, by control logic Active_Inhibit signal 621. Accordingly, operation of bitline driver circuit 600 with respect to a neighboring bitline is substantially the same as discussed above regarding an active target bitline. In an exemplary embodiment, at least two bitline driver circuits 600 are employed simultaneously during a write operation—one for controlling the voltage, such as 710, applied at a target bitline and the other for controlling the voltage, such as 712, applied at a neighboring bitline. As discussed above, a first output voltage 710 from a first bitline driver circuit and a second output voltage 712 from a second bitline driver circuit have a potential difference $\Delta V$ at a value tolerable by underlying semiconductor technology of the memory array such that there is minimal chance of a severe write disturb condition at an untargeted neighbor cell.

While FIG. 6 depicts a bitline driver circuit 600 configured to output either a ramped active target bitline voltage 710 or a ramped neighboring bitline voltage 712, it would be understood by one of ordinary skill in the art that separate driver circuits may be configured for driving only one of a target bitline voltage or a neighboring bitline voltage.

Figure 8:
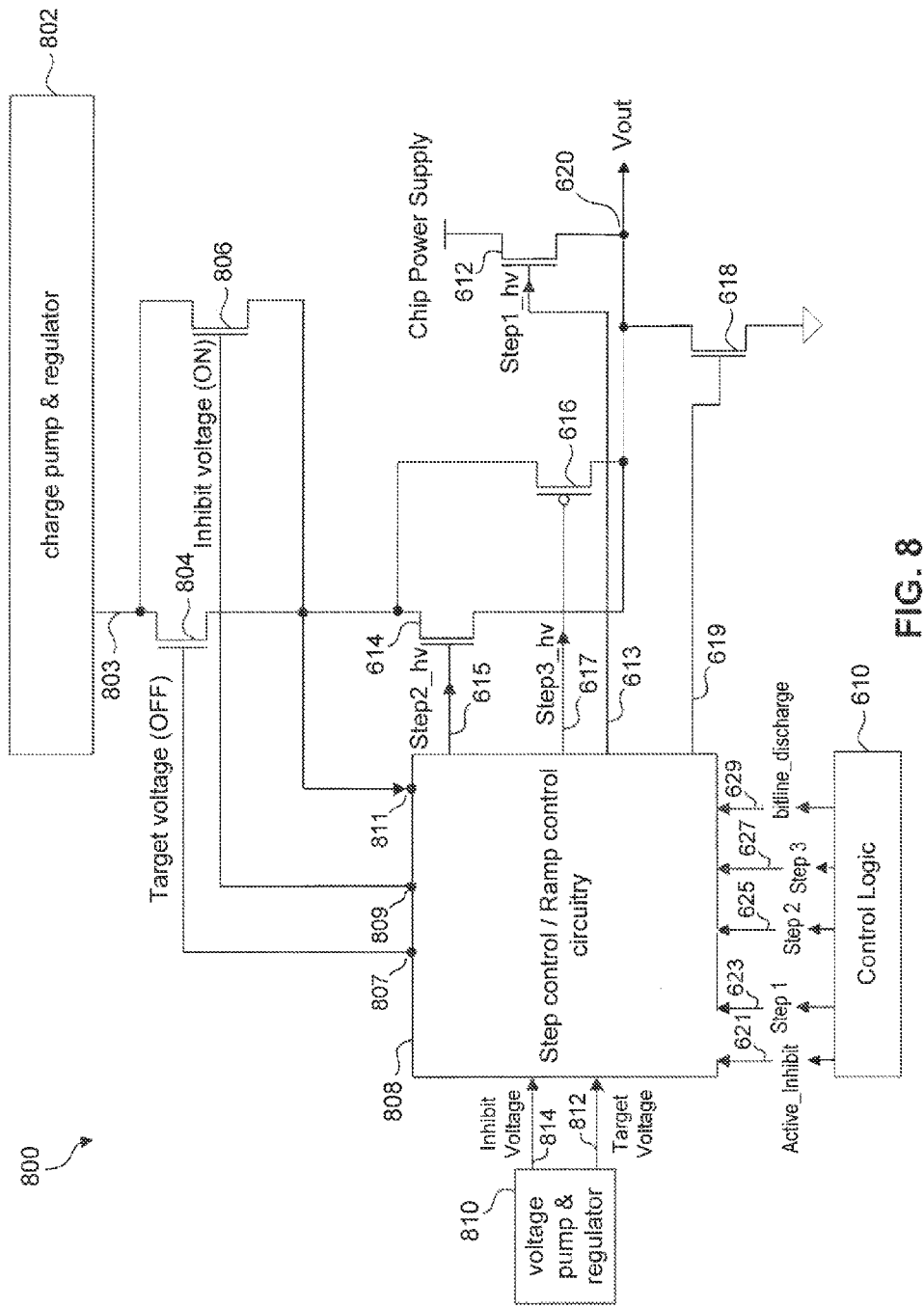
FIG. 8 is a schematic block diagram of an alternative bitline driver circuit for controlling a target bitline voltage and a neighboring bitline voltage in an exemplary embodiment of the present invention.

FIG. 8 depicts another bitline driver circuit 800 for use in a ramp controller/bitline driver block 406a and 406b of another exemplary embodiment of the present invention. Because much of the structure and operation of bitline driver circuit 800 is substantially the same as bitline driver circuit 600 shown in FIG. 6, only those substantial differences are detailed below. Those features of bitline driver circuit 800 which have substantially the same functionality as bitline driver circuit 600 have been identified by the same reference numerals.

As shown in FIG. 8, a bitline driver circuit 800 of an exemplary embodiment of the present invention includes charge pump and regulator circuitry 802 with a single output 803 which supplies a regulated voltage to terminals of transistors 804 and 806. Transistor 804 functions as a voltage controlled switch for a voltage signal to be applied to an active target bitline, such as bitline 420 shown in FIG. 4. Transistor 806 functions as a voltage controlled switch for a voltage signal to be applied to an untargeted neighbor bitline, such as bitline 422 shown in FIG. 4. One difference between bitline driver circuit 800 and bitline driver circuit 600 is that transistors 804 and 806 are preferably configured as NFETs, as such, the voltages output from terminals 807 and 809 and applied at their respective gates determines the potential value of output signal 620. As such, the voltage signals generated by ramp control circuitry 808 and output at terminals 807 and 809 are more precisely controlled to affect output voltage signal 620 applied to a selected bitline. Ramp control circuitry 808 generates and outputs voltage signals from terminal 807 or 809 according to Active_Inhibit control signal 621 output from control logic 610. Ramp control circuitry 808 receives a voltage signal at terminal 811 corresponding to a voltage generated by control of either transistor 804 or 806.

As shown in FIG. 8, bitline driver circuit 800 includes a voltage pump and regulator circuit 810 which supplies a desired active target bitline voltage control signal 812 and a disturb inhibit voltage control signal 814 to ramp control circuitry 808. Target bitline voltage control signal 812 and disturb inhibit voltage control signal 814 provide reference signals to ramp control circuitry 808 to enable ramp control circuitry 808 to output respective voltage control signals from terminals 807 and 809 according to a desired operation of the device. As discussed above, bitline driver circuit 800 functions substantially similar as bitline driver circuit 600 in response to control signals output from control logic circuitry 610.

In the exemplary embodiments, a first ramp rate may be utilized for an active target bitline voltage applied at each target bitline in a memory array. Additionally, the same ramp rate or a second ramp rate may be applied for a neighboring bitline voltage applied at each untargeted neighbor bitline. The ramp rates may be determined by modeling and simulating the respective bitline and memory cell behavior under applied voltages. The behavior of drivers or transistors, such as 612, 614, 616 in FIGS. 6 and 8 are also modeled to determine an ideal duration for each step or ramp during a write operation such that desired bitline and memory cell behavior is achieved. The step durations then can be controlled to ensure a potential difference at an untargeted neighboring memory cell is less than a desired potential difference to achieve a write operation.

Referring back to FIG. 4, as a result of controlling the potential difference between neighbor bitline 422 and active target bitline 420, much better $V_T$ distributions of individual memory cells can be achieved over the lifetime of a virtual ground memory array. The exemplary embodiments enable implementation of higher density memory arrays and compact devices without severely altering untargeted neighboring cells' $V_T$ distributions throughout write operations and cycling. Voltage control of untargeted neighboring bitlines, according to the exemplary embodiments, is advantageous because the additional system complexity is minimal, existing design re-use is high and ramping rate of the previously floating bitlines is fully controllable. Hence, based on technology requirements, select ramp rate or step size adjustments on untargeted neighboring bitlines can achieve optimum $V_T$ distributions on untargeted cells through careful characterization of the memory.

The above embodiments are effective in reducing a potential difference, ΔV shown in FIG. 7, between target and neighboring bitlines during a write operation, especially when no other neighbor memory cell of the same row in the memory array is targeted for a write operation. However, it is undesirable in many non-volatile memory devices to prevent simultaneous write operations of more than one cell per wordline. When more than one memory cell sharing a wordline is targeted for a write operation at any one time, there are certain configurations that may inhibit the above exemplary embodiments from achieving desired write speeds and stable $V_T$ distributions at an untargeted cell. Depending on decoding architecture, several bitline configurations can occur in a memory array during a write operation. For example, a drain bitline of a first targeted cell can be separated by any number of floating bitlines from an active source bitline of another target cell being written at the same time. This configuration is referred to as a drain-facing-source configuration. In another example, a drain bitline of a first targeted cell is separated by any number of floating bitlines from an active drain bitline of another target cell being written at the same time. This configuration is referred to as a drain-facing-drain configuration. When more than one cell of the same row is targeted at a given time, the applied bitline voltages at each target cell can affect the ramp rate of the target bitline or the floating bitline to adversely affect desired performance.

Figure 11:
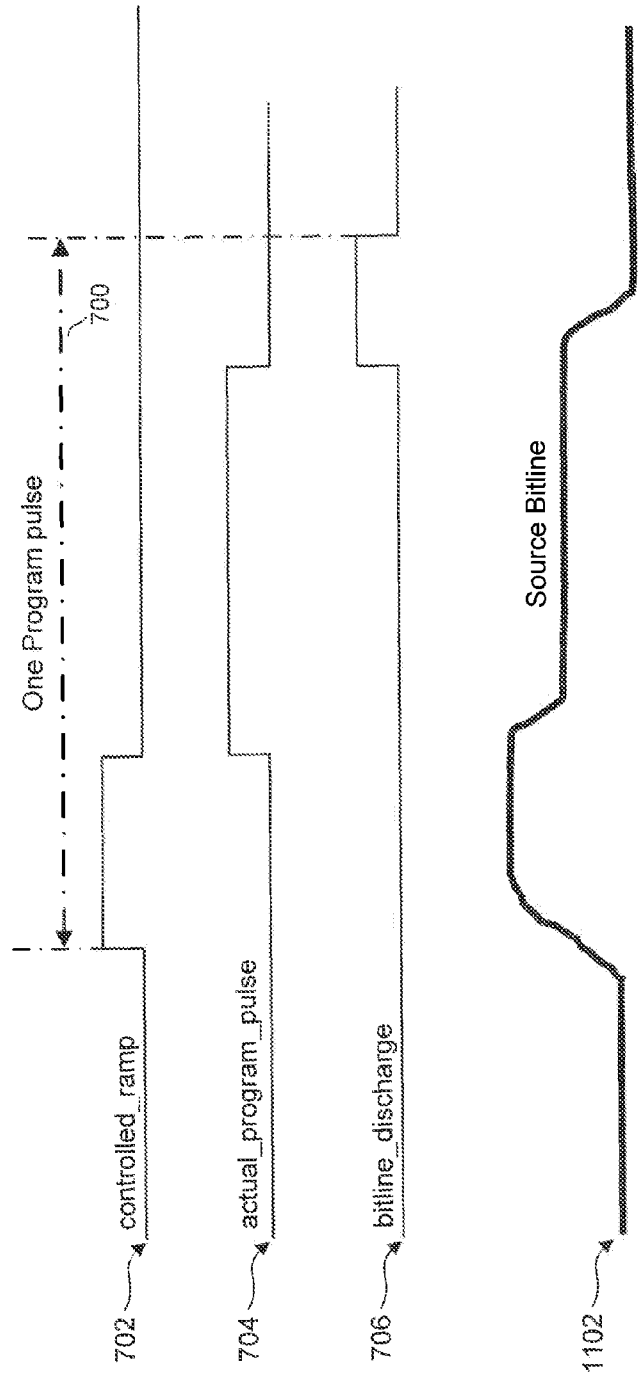
FIG. 11 is a timing diagram illustrating various digital control signals and the corresponding voltage waveforms on the bitlines of interest.

In an exemplary embodiment of the present invention, any adverse effects on desired performance due to simultaneous write operations are minimized by imparting additional voltage control at source bitlines during a write operation. Typically, a common source bias voltage is applied to a selected bitline corresponding to the source terminal of each targeted cell. The source bias voltage during a write operation is typically at or near ground potential throughout substantially the entire write operation. Without the additional voltage control at source bitlines of the exemplary embodiments, a voltage waveform of the source bitline may resemble that shown as 508 in FIG. 5C and 714 in FIG. 7. However, in an exemplary embodiment of the present invention, as shown in FIG. 11, a source bias voltage 1102 is ramped up to a higher than target voltage during the controlled ramp stage 702, and then brought down to the target source bias voltage at or near ground potential during the actual_program_pulse stage 704. The higher than target voltage is controlled to be less than a potential difference ΔV that may result in a write operation. Thus, the source bias voltage 1102 is controlled such that its higher than target voltage does not introduce additional write disturb conditions in untargeted neighboring cells.

Figure 9:
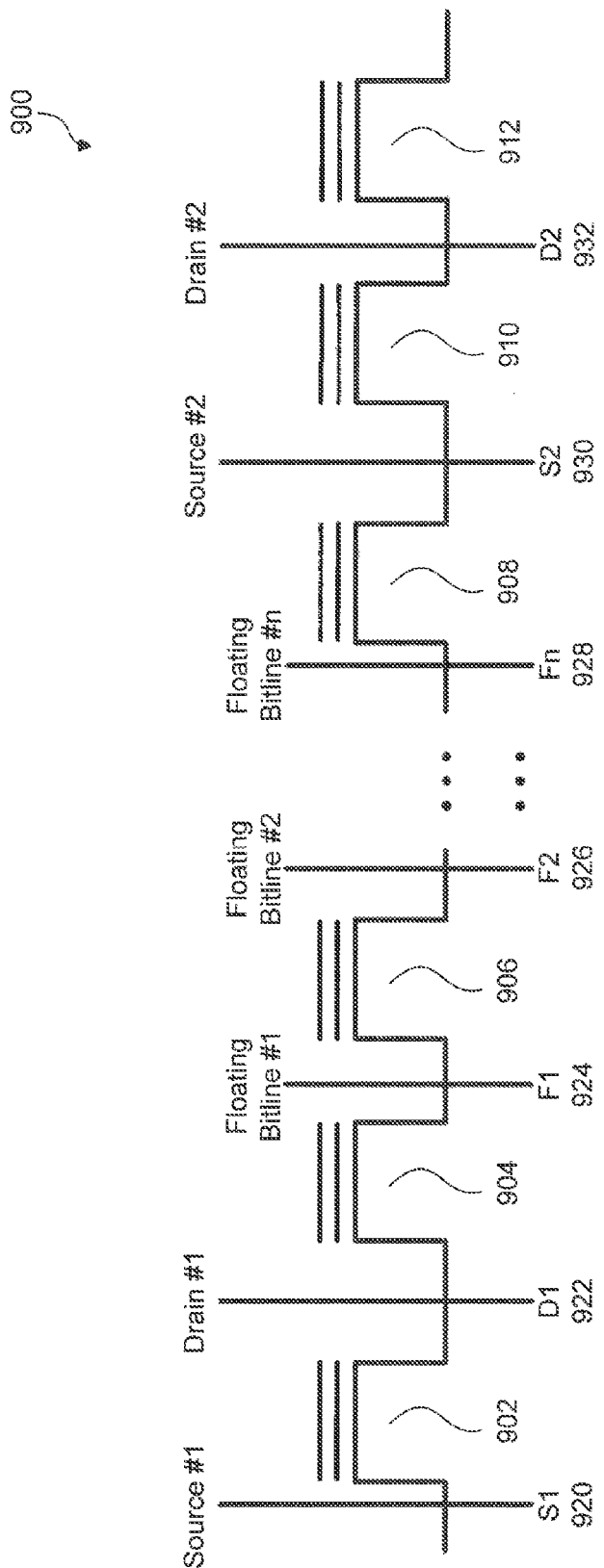
FIG. 9 is a schematic diagram of a partial row of transistor memory cells during a simultaneous write operation in an exemplary embodiment of the present invention.

In determining the extent to which control of an applied source bias voltage can improve performance in an exemplary device, it is useful to consider the worst possible configuration that may result in severe disturb conditions to untargeted cells. The least desirable configuration of a memory array with a simultaneous write operation is the drain-facing-source configuration, which is shown for example in FIG. 9. As shown, a partial memory array 900 includes a plurality of individual memory cells 902, 904, 906, 908, 910, 912. As an example, during a simultaneous write operation, memory cells 902 and 910 are designated as target cells to be written or programmed. In an example situation, not employing source bias control according to the exemplary embodiment, a source bias voltage at or near ground potential is applied at bitlines S1 920 and S2 930 corresponding to the respective source terminals of target memory cells 902 and 910. During a write operation, bitline D1 922, corresponding to a drain terminal of target memory cell 902, ramps up to a high voltage according to an applied voltage signal. At that time, floating or neighbor bitline F1 924 is electrically coupled with bitline 922 and is pulled up to a potential value by the ramping up of blithe 922, as discussed above. However, because "source" bitline 930 faces bitline 924 and is connected to a ground or close to ground potential, it tends to pull down the coupling potential of bitline 924 resulting in a greater potential difference between bitlines 922 and 924 during the controlled_ramp stage and the actual_program_pulse stage. Such pulldown effects are attributed to bitline to bitline leakage paths and bitline to bitline coupling effects.

For example, while bitline 922 is ramping up, neighboring bitline 924 needs to ramp up at a certain rate to avoid a large potential difference between these two metal bitlines so that an unwanted write disturb condition does not occur at untargeted cell 904, as discussed above. Bitline 924 will be coupling up while bitline 922 is ramping up, and such coupling up behavior will try to propagate from bitline 924 to 926 and to bitline Fn 928. During the write operation, bitlines 926 and 928, as well as any other bitlines between the two (not shown), are said to be "floating". At the same time, bitline 930 is at near ground potential hence its neighbor metal bitline 928 tends to be coupled down to near ground potential as well. This coupling down behavior tends to propagate across the memory array from bitline Fn 928 to bitline 924, causing an undesired pulldown effect on the ramp rate of the neighboring metal bitline 924. In this scenario, the ramp behavior of bitline 924 is determined by the number of memory cells between target cells 902 and 910, the states of the memory cells (programmed/erased) between 902 and 910, loading (RC) of the metal bitlines 924, 926, 928, and bitline to bitline coupling capacitance between them. Moreover, ramp behavior of neighboring bitline 924 can be determined based on the applied voltages at "drain" bitline 922 and facing "source" bitline 930, hence voltage control of a source bias voltage applied at bitline 930 can be used to ameliorate any negative effects on neighboring bitline 924.

In terms of pulldown effect on bitline 924 (induced from source bias voltage at bitline 930), the worst combination of cell states between target cells 902 and 910 is all of them being "erased". Such a memory array pattern will increase the conductivity of the untargeted cells 906, 908 for example, and increase the pulldown effects to couple down neighboring bitline 924 accordingly, thereby slowing down the ramp rate of bitline 924 as it attempts to couple up to the applied high voltage at bitline 922. Accordingly, a larger potential difference results between bitlines 922 and 924, hence contributing to a disturb phenomenon at memory cell 904.

Typically, a regulated supply voltage is connected to any metal bitline such as 920 and 930, which acts as a "source" during a write pulse. Traditionally, the regulated source supply voltage is connected throughout the entire write pulse or program pulse including the controlled_ramp portion 702 of the write or program pulse 700, as shown in FIG. 7. For example, "source" bitline connection at a source bias voltage is enabled for all three stages of program pulse 700 (controlled_ramp 702, actual_program_pulse 704, and bitline_discharge 706). The write operation of the target cell, however, occurs only during the actual_program_pulse stage 704 when a difference between a source bias potential and a drain bias potential results in an electric field sufficient to change the $V_T$ of the target memory cell. Thus, setting the source bias voltage at or near ground potential during controlled_ramp stage 702 of program pulse 700 is unnecessary and can slow down a ramp rate of active drain bitline 922 of a targeted memory cell 902 and its neighbor bitline 924. As discussed above, the ramp rate of an active "drain" bitline 922, for example, should be as fast as possible to realize fast write performance of target memory cell 902 while not ramping too fast so as to create a large potential difference between an active drain bitline 922 and its neighboring bitline 924.

In an exemplary embodiment, to improve the undesired impact of a near ground source bias voltage at bitline 920 and 930 on not only the ramp rate of active target bitline 922, but also the ramp rate of a neighboring bitline 924 during a simultaneous write operation, a "source" supply voltage, 1102 shown in FIG. 11, applied at source bitlines 920 and 930 should be set at or near a design limit during the bitline controlled_ramp stage 702 to enable more efficient ramping to take place in bitlines 922 and 924. In the exemplary embodiment, the source bias voltage 1102 is then brought down to a desired target level near ground during an actual_program_pulse stage 704, to enable a write operation. Accordingly, write disturbs can be minimized by imparting additional source bias voltage control on "source" bitlines during a write operation. As discussed above, the design limit corresponds to the potential difference ΔV that may result in a write operation. Thus, the source bias voltage 1102 is controlled such that its higher than target voltage does not introduce additional write disturb conditions in untargeted neighboring cells.

Figure 10:
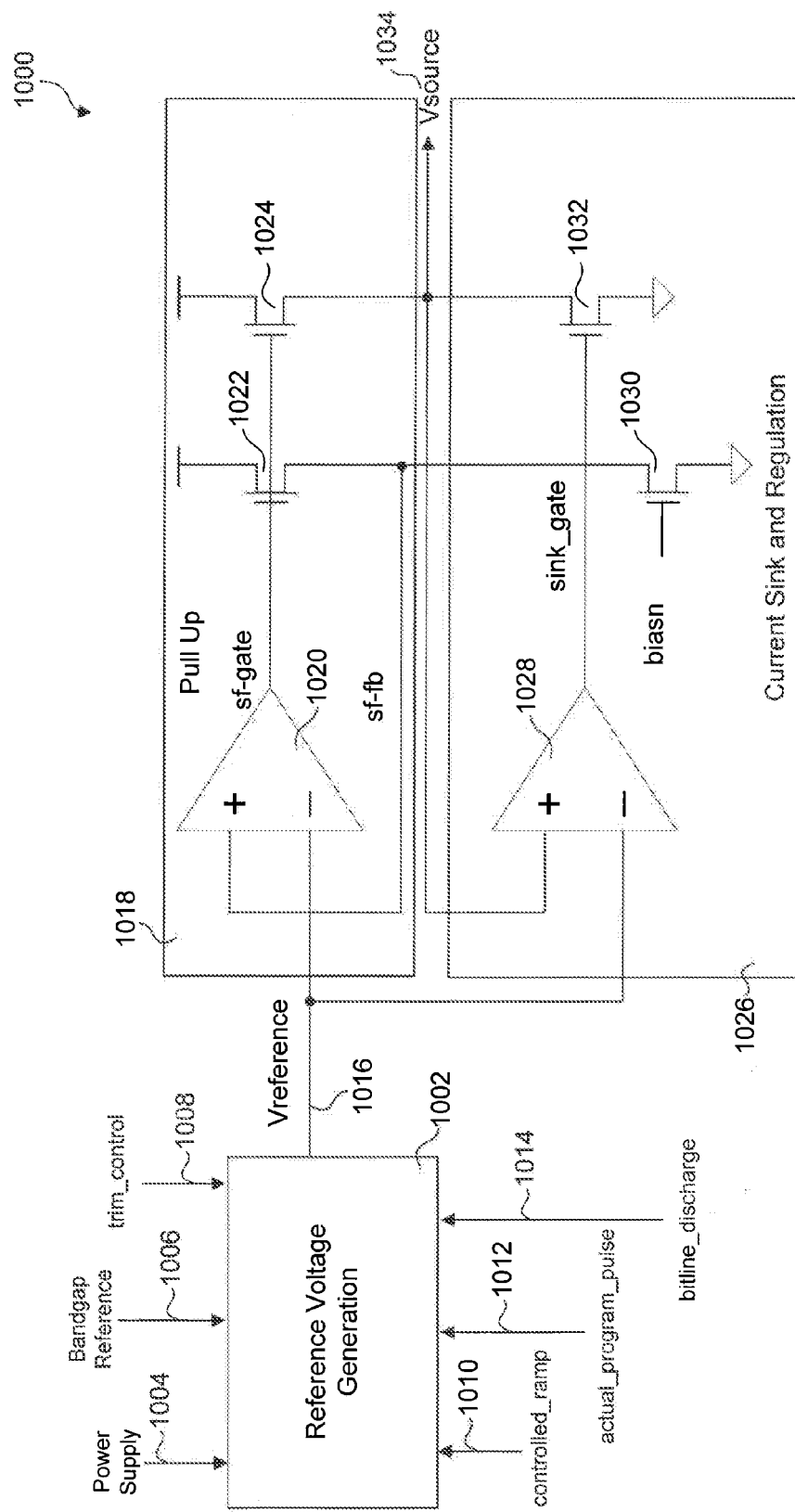
FIG. 10 is a schematic diagram of a bitline driver circuit for controlling a source bias voltage of targeted memory cells in an exemplary embodiment of the present invention.

As shown in FIG. 10, an exemplary embodiment of the present invention includes source voltage control circuit 1000 to adjustably control source bias voltage Vsource 1034 independent from active bitline driver ramp control shown in FIGS. 6 and 8, for example. Source voltage control circuit 1000 includes a reference voltage generation circuit block 1002 which includes a plurality of inputs to effect output of a reference voltage signal 1016. Reference voltage generation circuit block 1002 receives a plurality of control logic inputs which enable a specific reference voltage signal to be generated according to a stage of a write pulse. For example, when an input logic signal 1010, corresponding to a controlled_ramp stage 702 is asserted and received at the reference voltage generation circuitry 1002, circuitry 1002 outputs a reference voltage signal at a higher than target voltage level.

It is advantageous to drive a source bias voltage 1034, 1102 at or near design limits during a controlled_ramp stage 702 of a write pulse, when an active bitline voltage is ramping up. Additionally, when reference voltage generation circuitry 1002 receives asserted logic signal 1012, corresponding to actual_program_pulse stage 704, output voltage reference signal 1016 is configured to have a value at or near a target source bias voltage to effect Vsource 1034 to drop to a target voltage value for the duration of the actual_program_pulse stage 704 to enable a write operation at the target memory cell. At the end of the write operation, input logic signal 1014 corresponding to bitline_discharge stage 706 is asserted to indicate to reference voltage generation circuitry 1002 to discharge output voltage Vsource 1034.

In an exemplary embodiment, a higher than target source bias voltage signal applied during the controlled_ramp stage 702 is determined according to a tolerable voltage difference between a "drain" and "source" terminal without effecting a write condition. For example, referring to FIG. 9, a source bias voltage applied at "source" bitline 920 or 930 during a write pulse, cannot be too high that a write condition is caused on untargeted cell 908 due to a large potential difference between bitlines 928 and 930. Accordingly, in one embodiment, the source bias voltage signal is ramped up to a voltage value corresponding to the tolerated potential difference between an active target bitline and a neighboring bitline ΔV as discussed above with respect to FIGS. 6 and 8. As such, the source bias voltage value is as large as possible so as to reduce undesirable pull-down effects, without creating an additional disturb condition.

As shown in FIG. 10, reference voltage generation circuitry 1002 also receives a plurality of input signals 1004, 1006 and 1008 to effect adaptive control of the ramp rate and voltage level of output reference voltage signal 1016. For example, reference voltage generation circuitry 1002 receives a source power signal 1004, a bandgap reference voltage signal 1006 and a trim_control reference signal 1008. During a controlled_ramp stage 702, the source bias voltage at 1034 is controlled to be at a higher than target voltage level by manipulating trim control inside reference voltage generation circuitry 1002 according to the trim_control signal 1008. Before actual_program_pulse stage 704 begins, the source bias voltage 1034 is controlled to drop to a lower level where it stabilizes to a target level to allow the write operation at the target memory cell.

Source voltage control circuit 1000 further includes a pull-up circuit 1018 and sink and regulation circuit 1026, configured to drive a source bias voltage signal 1034 to a higher than target voltage and to stabilize the source bias voltage signal 1034 to a target level as discussed above. Pull-up circuit 1018 includes an amplifier circuit 1020 with an inverting input coupled to reference voltage signal 1016 and a non-inverting input coupled to a common node between transistors 1022 and 1030. Sink and regulation circuit 1026 includes an amplifier circuit 1028 with an inverting input coupled to reference voltage signal 1016 and a non-inverting inputs coupled to a common node between transistors 1024 and 1032. As shown, the output of amplifier circuit 1020 is coupled to each gate terminal of transistors 1022 and 1024 and the output of amplifier 1028 is coupled to the gate terminal of transistor 1032.

As a result of controlling the source bias voltage level during a controlled_ramp stage of a of a write pulse, the target bitline ramp rate has been shown to increase, and the floating bitline ramp rate has been shown to be less affected by a concurrent write operation at another memory cell sharing a wordline. This method has a direct impact on improving write speed and achieving better $V_T$ distributions by reducing possible disturb effects over the lifetime of a virtual ground memory array. This approach enables the design of faster products while minimizing $V_T$ shift or write disturb effects on untargeted neighboring cells due to ramp-rate related issues, especially during a concurrent write operation.

In one embodiment, source bias voltage control is implemented during each write operation independently from any concurrent neighboring bitline ramp control discussed with respect to FIGS. 6 and 8. In another embodiment, source bias voltage control is preferably implemented when a particular configuration of a memory array necessitates the source bias voltage control, or when a concurrent write operation is performed on a row in a memory array. In another exemplary embodiment, source bias voltage control during a write operation may be performed in conjunction with the exemplary neighboring bitline ramp rate control discussed with respect to FIGS. 6 and 8.

Process

Figure 12:
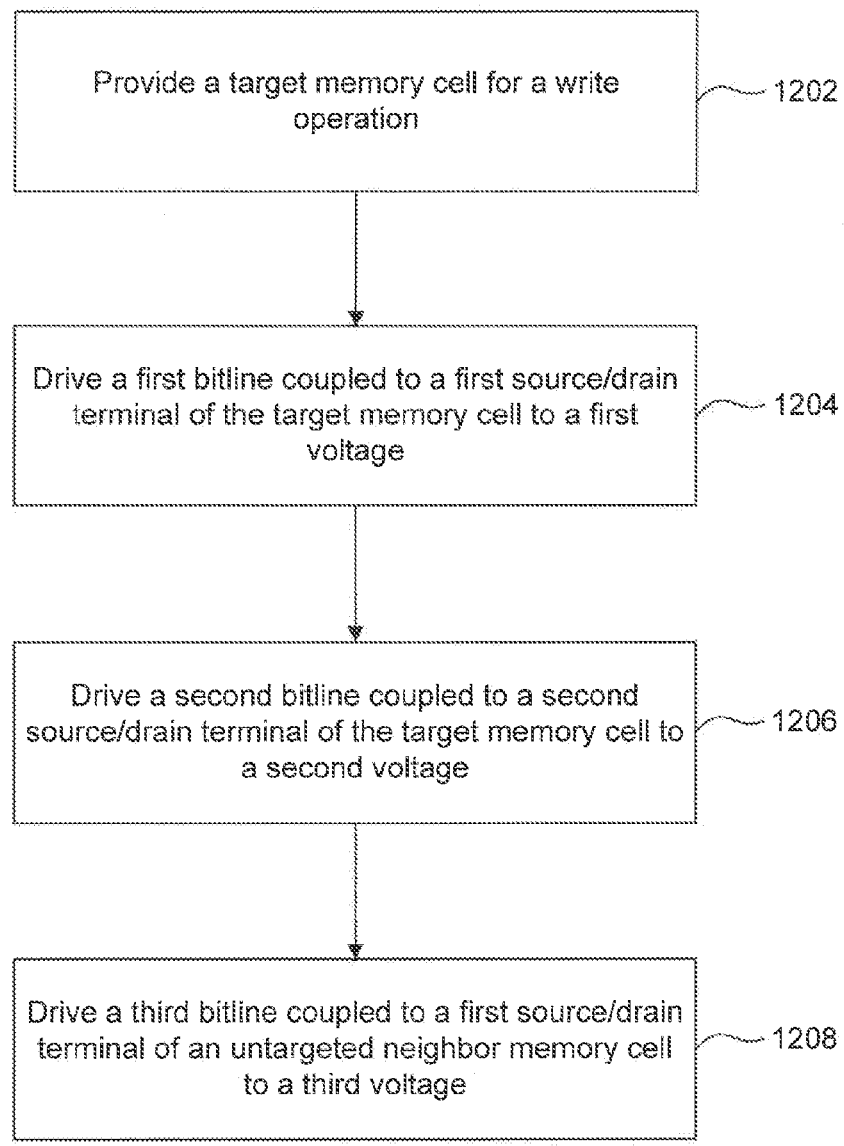
FIGS. 12 and 13 are flow diagrams illustrating methods in accordance with the present invention.

In view of the above circuit configurations, exemplary embodiments of the present invention provide a method for minimizing write disturb conditions in a memory array of a non-volatile memory device. Referring to FIG. 12, a method is provided for driving bitlines corresponding to a target memory cell and an untargeted neighbor memory cell during a write operation. In step 1202, a memory cell in a non-volatile memory array is provided as a target memory cell for a write operation. In step 1204, a first bitline coupled to a first source/drain terminal of the target memory cell is driven to a first voltage. In step 1206, a second bitline coupled to a second source/drain terminal of the target memory cell is driven to a second voltage. The first bitline corresponds to a "source" bitline of the target memory cell, whereas the second bitline corresponds to a "drain" terminal of the target memory cell. In step 1208, a third bitline coupled to a first source/drain terminal of an untargeted neighbor memory cell is driven to a third voltage. Each of steps 1202, 1204, 1206, and 1208 occur during the write operation of the target memory cell. In this embodiment, the third voltage reduces an electric field between first and second source/drain terminals of the untargeted neighbor memory cell.

Figure 13:
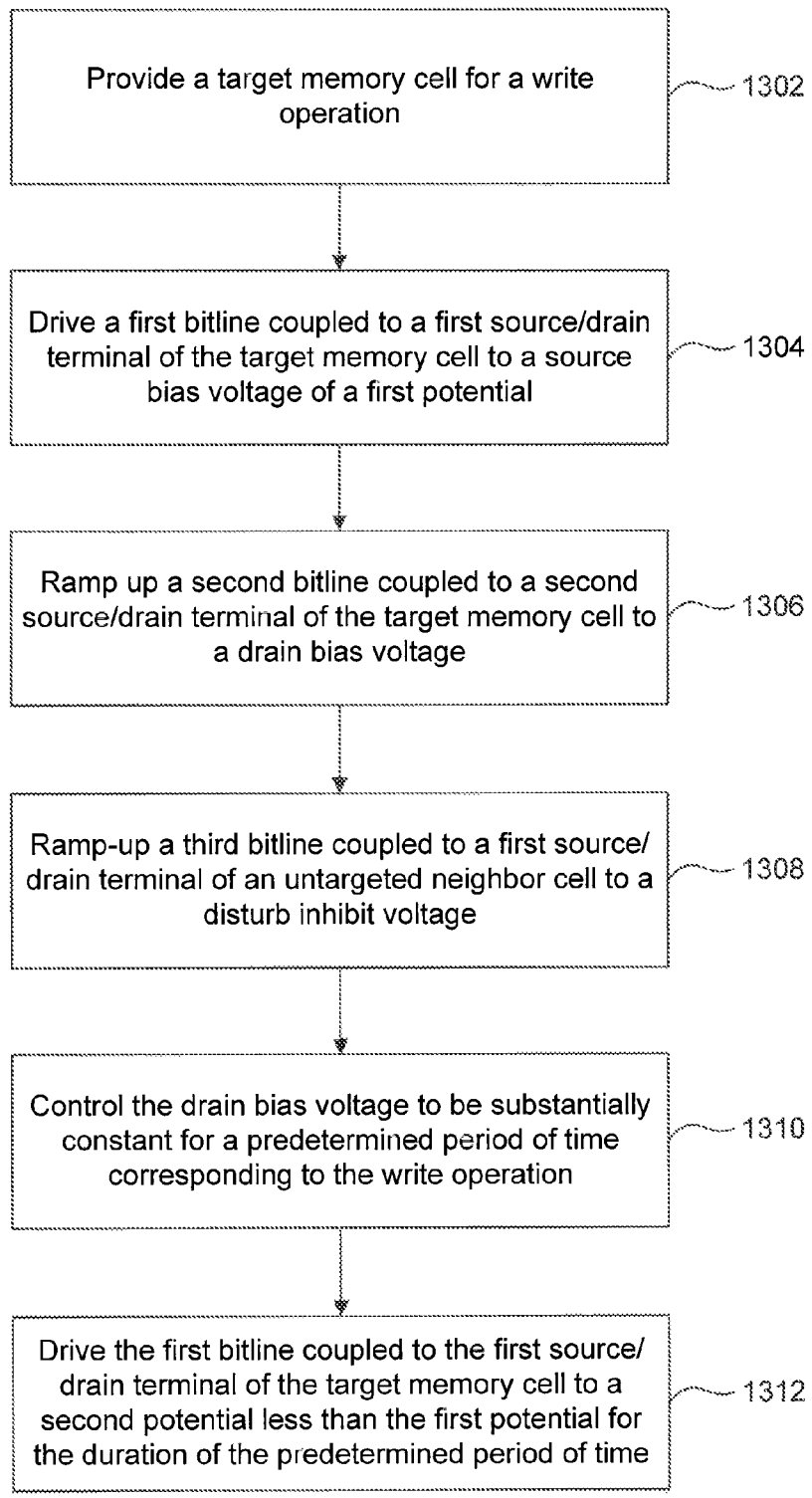

Referring to FIG. 13, another method is provided for performing a write operation to a target memory cell in a non-volatile memory array. In step 1302, a memory cell is provided as a target memory cell for a write operation. In step 1304, a first bitline coupled to a first source/drain terminal of the target memory cell is driven to a source bias voltage of a first potential. In step 1306, a second bitline coupled to a second source/drain terminal of the target memory cell is ramped up to a drain bias voltage. In step 1308, a third bitline coupled to a first source/drain terminal of an untargeted neighbor cell is ramped-up to a disturb inhibit voltage. In step 1310, the drain bias voltage is controlled to be substantially constant for a predetermined period of time corresponding to the write operation. In step 1312, the first bitline coupled to the first source/drain terminal of the target memory cell is then driven to a second potential less than the first potential for the duration of the predetermined period of time.

CONCLUSION

It is to be appreciated that the Detailed Description section, and not the Abstract of the Disclosure, is intended to be used to interpret the claims. The Abstract of the Disclosure may set forth one or more, but not all, exemplary embodiments of the invention, and thus, is not intended to limit the invention and the subjoined Claims in any way.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the subjoined Claims and their equivalents.

What is claimed is:

1. A method comprising:
providing a target memory cell for a write operation in a non-volatile memory array;
driving a first bitline coupled to a first source/drain terminal of the target memory cell to a first voltage during the write operation;
driving a second bitline coupled to a second source/drain terminal of the target memory cell to a second voltage during the write operation; and
driving a third bitline coupled to a first source/drain terminal of an untargeted neighbor memory cell in the non-volatile memory array to a third voltage during the write operation of the target memory cell;
wherein the second voltage comprises a first predetermined waveform and the third voltage comprises a second predetermined waveform, the first and second predetermined waveforms being offset from each other by a predetermined voltage difference;
wherein the predetermined voltage difference is less than a minimum voltage difference to enable a write operation at the untargeted neighbor memory cell.

2. The method of claim 1, wherein the third voltage reduces an electric field between the first source/drain terminal of the untargeted memory cell and a second source/drain terminal of the untargeted neighbor memory cell; and
wherein the second source/drain terminal of the untargeted neighbor memory cell corresponds to the second source/drain terminal of the target memory cell.

3. A method comprising:
providing a target memory cell for a write operation in a non-volatile memory array;
driving a first bitline coupled to a first source/drain terminal of the target memory cell to a first voltage during the write operation;
driving a second bitline coupled to a second source/drain terminal of the target memory cell to a second voltage during the write operation; and
driving a third bitline coupled to a first source/drain terminal of an untargeted neighbor memory cell in the non-volatile memory array to a third voltage during the write operation of the target memory cell;
wherein the second voltage comprises a first predetermined waveform and the third voltage comprises a second predetermined waveform, the first and second predetermined waveforms being offset from each other by a predetermined voltage difference;
wherein the first predetermined waveform includes a ramped portion of increasing voltage and a stable portion of substantially constant voltage for a predetermined period.

4. The method of claim 3, wherein the first voltage comprises a third predetermined waveform including a first portion at an increased voltage and a second portion at a reduced voltage.

5. The method of claim 4, wherein the first portion at an increased voltage substantially coincides with the ramped portion of the first predetermined waveform, and the second portion substantially coincides with the stable portion of the first predetermined waveform.

6. A method comprising:
providing a target memory cell for a write operation in a non-volatile memory array;
driving a first bitline coupled to a first source/drain terminal of the target memory cell to a first voltage during the write operation;
driving a second bitline coupled to a second source/drain terminal of the target memory cell to a second voltage during the write operation; and
driving a third bitline coupled to a first source/drain terminal of an untargeted neighbor memory cell in the non-volatile memory array to a third voltage during the write operation of the target memory cell;

wherein the second voltage comprises a first predetermined waveform and the third voltage comprises a second predetermined waveform, the first and second predetermined waveforms being offset from each other by a predetermined voltage difference;

wherein the second predetermined waveform includes a ramped portion of increasing voltage and a stable portion of substantially constant voltage for a predetermined period.

7. The method of claim 6, wherein the first voltage comprises a third predetermined waveform including a first portion at an increased voltage and a second portion at a reduced voltage.

8. The method of claim 7, wherein the first portion at an increased voltage substantially coincides with the ramped portion of the first predetermined waveform, and the second portion substantially coincides with the stable portion of the first predetermined waveform.

9. A non-volatile memory device comprising:
 a first bitline driver configured to drive a first bitline coupled to a source/drain terminal of a target memory cell to a first voltage during a write operation at the target memory cell; and
 a second bitline driver configured to drive a second bitline coupled to a first source/drain terminal of an untargeted neighbor memory cell to a second voltage during the write operation, wherein the second voltage reduces an electric field between the first source/drain terminal and a second source/drain terminal of the untargeted neighbor memory cell;
 wherein the first bitline driver and the second bitline driver are configured such that the first and second voltage are offset from each other by a predetermined voltage difference that is less than a minimum voltage difference to enable a write operation at the untargeted neighbor memory cell.

10. The non-volatile memory device of claim 9, wherein the source/drain terminal of the target memory cell corresponds to the second source/drain terminal of the untargeted neighbor memory cell.

11. The non-volatile memory device of claim 9, further comprising a third bitline driver configured to drive a third bitline coupled to a second source/drain terminal of the target memory cell to a source bias voltage during the write operation at the target memory cell.

12. The non-volatile memory device of claim 9, wherein the first bitline driver is configured to drive the first bitline such that the first voltage comprises a first predetermined ramped waveform and the second bitline driver is configured to drive the second bitline such that the second voltage comprises a second predetermined ramped waveform; and
 wherein the first bitline driver is configured such that the first predetermined ramped waveform includes a ramped portion of increasing voltage and a stable portion of substantially constant voltage for a predetermined period.

13. The non-volatile memory device of claim 12, wherein a third bitline driver is configured to drive a third bitline to an initial first voltage and then to a reduced voltage during the write operation at the target memory cell.

14. A non-volatile memory device, comprising:
 a first bitline driver configured to drive a first bitline coupled to a source/drain terminal of a target memory cell to a first voltage during a write operation at the target memory cell; and
 a second bitline driver configured to drive a second bitline coupled to a first source/drain terminal of an untargeted neighbor memory cell to a second voltage during the write operation, wherein the second voltage reduces an electric field between the first source/drain terminal and a second source/drain terminal of the untargeted neighbor memory cell;
 wherein the first bitline driver is configured to drive the first bitline such that the first voltage comprises a first predetermined ramped waveform and the second bitline driver is configured to drive the second bitline such that the second voltage comprises a second predetermined ramped waveform.

15. The non-volatile memory device of claim 14, wherein the first bitline driver is configured such that the first predetermined ramped waveform includes a ramped portion of increasing voltage and a stable portion of substantially constant voltage for a predetermined period.

16. The non-volatile memory device of claim 15, wherein a third bitline driver is configured to drive a third bitline to an initial first voltage and then to a reduced voltage during the write operation at the target memory cell.

17. A method for performing a write operation to a target memory cell in a non-volatile memory array, the method comprising:
 driving a first bitline coupled to a first source/drain terminal of the target memory cell to a source bias voltage of a first potential;
 ramping a second bitline coupled to a second source/drain terminal of the target memory cell up to a drain bias voltage, wherein the drain bias voltage is controlled to be substantially constant for a predetermined period of time; and
 driving the first bitline coupled to the first source/drain terminal of the target memory cell to a second potential less than the first potential for substantially the duration of the predetermined period of time.

18. The method of claim 17, further comprising:
 ramping a third bitline coupled to a first source/drain terminal of an untargeted neighbor memory cell up to a disturb inhibit voltage, wherein the disturb inhibit voltage reduces an electric field between the first source/drain terminal and a second source/drain terminal of the untargeted neighbor memory cell.

19. The method of claim 18, wherein the disturb inhibit voltage is offset from the drain bias voltage by a predetermined voltage difference.

20. The method of claim 19, wherein the predetermined voltage difference is less than a minimum voltage difference to enable a write operation at the untargeted neighbor memory cell.

* * * * *